United States Patent
Konno et al.

(10) Patent No.: US 6,543,258 B1
(45) Date of Patent: Apr. 8, 2003

(54) GLASS FIBER NONWOVEN FABRIC AND PRINTED WIRING BOARD

(75) Inventors: Michio Konno, Fukushima (JP); Yasushi Miura, Fukushima (JP); Shoichi Saito, Fukushima (JP); Shin Kasai, Fukushima (JP)

(73) Assignee: Nitto Boseki Co., Ltd., Fukushima (JP)

( * ) Notice: Subject to any disclaimer, the term of this patent is extended or adjusted under 35 U.S.C. 154(b) by 0 days.

(21) Appl. No.: 09/555,401

(22) PCT Filed: Oct. 1, 1998

(86) PCT No.: PCT/JP98/05403

§ 371 (c)(1),
(2), (4) Date: May 30, 2000

(87) PCT Pub. No.: WO99/28543

PCT Pub. Date: Jun. 10, 1999

(30) Foreign Application Priority Data

Dec. 2, 1997 (JP) ............................................. 9-347076
Jun. 22, 1998 (JP) ........................................... 10-174922

(51) Int. Cl.$^7$ ......................................................... C03B 37/083
(52) U.S. Cl. .................................................................. 65/497
(58) Field of Search ........................................... 65/497

(56) References Cited

U.S. PATENT DOCUMENTS

| | | | |
|---|---|---|---|
| 3,010,146 A | * 11/1961 | Warthen ....................... 57/258 |
| 3,309,184 A | * 3/1967 | Stalego ........................ 425/464 |
| 3,475,147 A | * 10/1969 | Stalego ........................ 425/114 |
| 3,988,135 A | 10/1976 | Coggin, Jr. |
| 4,197,103 A | 4/1980 | Ishikawa et al. ................. 65/2 |
| 4,380,462 A | 4/1983 | Shono et al. |
| 4,698,083 A | * 10/1987 | Shioura et al. ......... 264/177.13 |
| 4,759,784 A | * 7/1988 | Shono et al. ............. 264/177.2 |
| 4,900,614 A | 2/1990 | Miyazato et al. |
| 5,462,571 A | * 10/1995 | Taguchi et al. ................ 65/437 |

FOREIGN PATENT DOCUMENTS

| | | |
|---|---|---|
| EP | 0 196 194 | 10/1986 |
| EP | 0 199 328 | 10/1986 |
| EP | 0 601 803 | 6/1994 |
| FR | 2 362 087 | 3/1978 |
| JP | 62-265142 | * 11/1987 |
| JP | 2-173047 | 7/1990 |
| JP | 6-228806 | 8/1994 |
| JP | 6-234540 | * 8/1994 |
| JP | 6-257042 | 9/1994 |
| JP | 7-18186 | 1/1995 |

(List continued on next page.)

OTHER PUBLICATIONS

Japanese 7–122235 B corresponds to Japan Kokai Tokkyo; Abstract of KOHO; JP 87170598, "Inorganic Fiber Boards", Michio Sato et al., 1 Page, Jul. 27, 1987.

Kozo; "Orifice Plate and Noncircular Sectioned Glass Fiber"; vol. 18, No. 610; Nov. 21, 1994; Publication No. JP 06 234540; Publication Date: Aug. 23, 1994; Abstract.

*Primary Examiner*—Sean Vincent
(74) *Attorney, Agent, or Firm*—Foley & Lardner

(57) ABSTRACT

A nonwoven fabric is constructed of a highly flat glass fiber which is a glass fiber whose section is flat and has a flatness ratio of 2.0 to 10 and which has such a section that the packing fraction is at least 85%, preferably at least 90%. In this nonwoven fabric, the glass fiber section has a shape near rectangle, and hence, the glass fibers can be arranged very densely to form a thin nonwoven fabric having a high bulk density, and when it is used as a laminate material, the glass fiber content can be increased and the surface smoothness can simultaneously be enhanced and can be used appropriately as a reinforcing material for a printed wiring board. Moreover, the above flat glass fiber can be produced by use of, for example, a nozzle having such a shape that one side of the major axis walls of a nozzle chip having a flat nozzle hole is partly notched.

6 Claims, 11 Drawing Sheets

FOREIGN PATENT DOCUMENTS

| | | |
|---|---|---|
| JP | 7-126033 | 5/1995 |
| JP | 7-133132 | 5/1995 |
| JP | 7-122235 | 12/1995 |
| JP | 8-127994 | 5/1996 |
| JP | 9-195196 | 7/1997 |
| JP | 9-228290 | 9/1997 |
| JP | 10-102393 | 4/1998 |
| TW | 6823752 | 12/1979 |
| TW | 6922102 | 7/1980 |
| TW | 77105800 | 3/1990 |
| TW | 82210411 | 7/1993 |

\* cited by examiner (a)

(b)

(a)

(b)

(a)

(b)

(a)

(b)

(a)

(b)

(c)

(a)

(b)

(c)

GLASS FIBER NONWOVEN FABRIC AND PRINTED WIRING BOARD

TECHNICAL FIELD

This invention relates to a glass fiber nonwoven fabric suitable for use as an insulation-reinforcing material for a glass fiber-reinforced laminate, such as a double-copper-clad, printed wiring board, a multilayered printed wiring board or the like, and also relates to a printed wiring board in which the above glass fiber nonwoven fabric is used.

Moreover, this invention relates to a highly flat glass fiber to be used in the production of a glass nonwoven fabric or the like and to a nozzle chip for spinning a highly flat glass fiber, a method for placing nozzle chips and apparatus for producing a glass fiber.

BACKGROUND ART

Recently, a glass cloth has been broadly used as an insulation-reinforcing material for a printed wiring board and partly, a glass fiber nonwoven fabric (also named glass paper) has also been used. For example, in the field of low price goods, there is used a double-copper-clad, printed wiring board which is called Composite CEM-3 in which a glass fiber nonwoven fabric is used as a core material and a glass cloth is used on both sides. The glass fiber nonwoven fabric used here is one obtained by subjecting a dispersion in water of glass fibers having a circular section of 3 to 10 $\mu$m in diameter and having a length of about 3 to 25 mm to papermaking by a paper machine, and usually, it has a thickness of 100 to 700 $\mu$m and an apparent amount of about 25 to 100 g/m$^2$.

However, the bulk density of the conventional glass fiber nonwoven fabric is low, so that in a printed wiring board in which the glass fiber nonwoven fabric is used, the amount of a resin contained in the printed wiring board becomes large, and there have been such problems that as compared with a glass-epoxy resin printed wiring board in which the surfaces and the layer of the whole of the core material are composed of glass cloth, the coefficient of thermal expansion of the core material portion is large and the reliability of the through-hole plating portion is inferior.

Furthermore, since the conventional glass fiber nonwoven fabric is formed by subjecting circular cross-section glass fibers to papermaking, substantially no entanglement is present between fibers, and hence, a large amount of a binder (for example, 10 to 13% by weight) is applied for imparting the necessary tensile strength to the glass fiber nonwoven fabric. However, surface active agents to be contained in an emulsion type adhesive used as the binder have such characteristics as to lower the binding power between glass fiber surface and matrix resin, and hence, there are such issues that with an increase of the amount of the binder, the lowering of the binding power between glass fiber surface and matrix resin becomes large, the hot water resistance and heat resistance are deteriorated, and the insulation resistance after pressure cooker test is deteriorated.

In addition, generally, in the course of producing a prepreg, such a so-called sink mark is caused that the solvent in the resin is removed, the volume of the resin portion is reduced, and the resin is moved from the surface to the interior, and in the molding step, too, the volume shrinkage of the resin is caused after hot pressing under pressure. However, when a prepreg is produced using a glass fiber nonwoven fabric on the surface, a copper foil is laminated to the surface thereof and the resultant is subjected to press molding, the bulk density of the glass fiber nonwoven fabric is low and the amount of the resin becomes large, so that the sinking phenomenon is marked and the volume shrinkage of the resin is largely caused. Therefore, irregularities approximate to 10 $\mu$m are formed on the resin face on the surface of the laminate produced and similar irregularities appear even on the copper foil laminated thereto. Hence, when a circuit is formed by partly removing the copper foil by etching or the like, the copper foil in the concave portions tends to remain (is hardly removed) and the copper foil in the convex portions is easily removed, so that the fine circuit is disconnected, or erroneously connected through the remaining copper foil. Moreover, the adhesion of copper foil becomes uneven and hence similar problems such as disconnection and the like are caused. Therefore, the conventional glass fiber nonwoven fabric cannot be used on the surface to which a copper foil is to be laminated.

Thus, the conventional glass fiber nonwoven fabric is inferior to glass cloth in the characteristics when used in a printed wiring board, and cannot be used on the surface. Therefore, it must be used in the intermediate layer of a double-copper-clad, printed wiring board.

Therefore, an attempt for improving the characteristic of the conventional glass fiber nonwoven fabric to enable it to be used in the printed wiring board in place of the glass cloth has been made using glass fibers having a modified cross section and a proposal is disclosed in JP-B-7(1995)-122,235, JP-A-6(1994)-257,042, JP-A-8(1996)-127,994 and the like. In these official publications, there are proposed glass fiber nonwoven fabrics prepared using flat glass fibers having a flat sectional shape such as elliptic shape, cocoon shape, capsule shape or the like, and the publications describe that these can make the bulk density large and simultaneously can increase the tensile strength. In addition, JP-A-6(1994)-257,042 describes that by using the flat cross-section glass fibers, the amount of the binder can be reduced (down to about 3% by weight).

Surely, it is possible to increase the bulk density of the nonwoven fabric to some extent by use of the glass fibers having a flat sectional shape and to make the irregularities on the surface as small as about 4 $\mu$m when the glass fiber nonwoven fabric on the surface of a laminate is used. However, for the glass fiber nonwoven fabric to be used in place of the glass cloth, a further improvement in characteristics is desired, particularly a high content and an improvement in surface smoothness have been desired.

Recently, as, for example, electronic equipment has been miniaturized and the performance thereof has been made high, there has been used a laminate of a plurality of circuit boards which is called a multilayered board (or a multilayered printed wiring board). As a result, it is desired that the width of the line constituting the circuit is made still smaller to closely place the same. For responding to such demands, it is desired that the copper foil is made as thin as possible (for example, about 12 $\mu$m or less); however, when the copper foil is made thin, it follows that the copper foil is more greatly affected by the irregularities on the laminate surface to which the copper foil is to be laminated. Therefore, it is required to further enhance the surface smoothness of the laminate. However, even in laminates in which the conventional glass cloth is used, the limit of the surface smoothness is about 3 $\mu$m, and no higher smoothness can be obtained. In this respect, there has been a limit in the reduction of copper foil thickness. Accordingly, there has been desired development of a reinforcing material by which the surface smoothness of the laminate can be improved as compared with the case where a glass cloth is used, and development of a glass fiber nonwoven fabric meeting the said desire has been desired.

Furthermore, when a glass fiber nonwoven fabric is used in the multilayered printed wiring board, it is desirable that the above glass fiber nonwoven fabric is as thin as possible, and one having an apparent amount of about 15 to 40 g/m$^2$ is required. However, with such a thin glass fiber nonwoven fabric, there has also been such a problem that the amount of the binder cannot be made so small for maintaining the necessary strength. For example, JP-A-6(1994)-257,042 describes that the amount of the binder can be made 3% by weight; however, this is a case where the nonwoven fabric is thick, and according to the present inventors' duplication, as shown in Comparative Examples 1 and 2 which are described hereinafter, no prepreg was able to be prepared when the apparent amount was 20 g/m$^2$ and the amount of the binder was 6% by weight, and an amount of 10% by weight was required for maintaining the necessary strength for preparing a prepreg.

DISCLOSURE OF INVENTION

This invention has been made based on such demands and aims at not only increasing the bulk density of the nonwoven fabric, but also providing a thin glass fiber nonwoven fabric having the necessary strength even when the amount of a binder is decreased, which makes it possible to increase the glass fiber content in a laminate in which the above glass fiber nonwoven fabric is used as a reinforcing material and to enhance the surface smoothness thereof, and also aims at providing a printed circuit board composed of a laminate in which the above glass fiber nonwoven fabric is used as a reinforcing material.

Moreover, this invention aims at providing such a highly flat glass fiber that the flatness ratio represented by the longest major axis/longest minor axis rectangular to the longest major axis of the section of flat glass fiber is 2.0 to 10 and the ratio of the sectional area of flat glass fiber to the area of a rectangle circumscribed about the section of flat glass fiber (the ratio is hereinafter referred to as the packing fraction) is at least 85%, preferably 90 to 98%.

Furthermore, this invention aims at providing a nozzle chip for spinning a glass fiber which enables the above-mentioned flat glass fiber to be produced with stable quality and with good productivity and a process or placing nozzle chips therefor.

For achieving the above-mentioned objects, the present inventors have made various examinations on the sectional shape of a glass fiber to be used in a glass fiber nonwoven fabric and have consequently found that when a nonwoven fabric is prepared by a papermaking method using such a highly flat glass fiber whose section has a flat shape that the flatness ratio of said section is 2.0 to 10, preferably 3.1 to 8 and the packing fraction is at least 85%, preferably at least 90% and more preferably 93 to 98%, there can be prepared a thin nonwoven fabric in which almost all flat glass fibers are piled one on another with the flat side down and simultaneously the area of contact of the piled flat glass fibers with one another becomes large, and even when the amount of a binder is as very small as about 3 to 8% by weight, the nonwoven fabric has the strength necessary for handling; that the nonwoven fabric obtained has a high bulk density; and that the surface smoothness of a laminate prepared with the nonwoven fabric is very good, whereby this invention has been accomplished.

That is to say, the glass fiber for forming the glass fiber nonwoven fabric in this invention is a highly flat glass fiber whose section has a flat shape (abbreviated hereinafter merely as "the flat glass fiber" in some cases), the flatness ratio of the section is 2.0 to 10, preferably 3.1 to 8, and the packing fraction thereof is at least 85%, preferably at least 90% and more preferably 93 to 98%. And, the glass fiber nonwoven fabric of this invention is such that a flat glass fiber having the above-mentioned specific flatness ratio and packing fraction and having a reduced fiber diameter of 5 to 17 μm is used in a proportion of at least 90% by weight based on the total nonwoven fabric weight excluding the weight of the binder and the amount of the binder is adjusted to 3 to 8% by weight.

In the glass fiber nonwoven fabric of this invention, the highly flat glass fiber having the above-mentioned construction is used, and therefore, when a nonwoven fabric is formed by subjecting the above flat glass fiber to papermaking, almost all flat glass fibers become piled one on another with the flat side down, hence, the bulk density becomes high and simultaneously the area of contact of the piled flat glass fibers with one another is increased, the binding with a small amount of a binder can impart a large strength to the nonwoven fabric, and the smoothness of the surface of the nonwoven fabric per se is good. Thus, this invention can provide a glass fiber nonwoven fabric which is thin and has a large bulk density and a high surface smoothness and in which the amount of a binder used is small, and a laminate prepared using the above glass fiber nonwoven fabric has a high glass fiber content, a good dimensional stability, excellent water resistance and heat resistance and further has an excellent surface smoothness. Therefore, by using it as an insulation-reinforcing material for a printed wiring board in place of the glass cloth, a high performance printed wiring board can be produced.

BEST MODES FOR CARRYING OUT THE INVENTION

This invention is explained in detail below.

Highly Flat Glass Fiber

Figure 2:
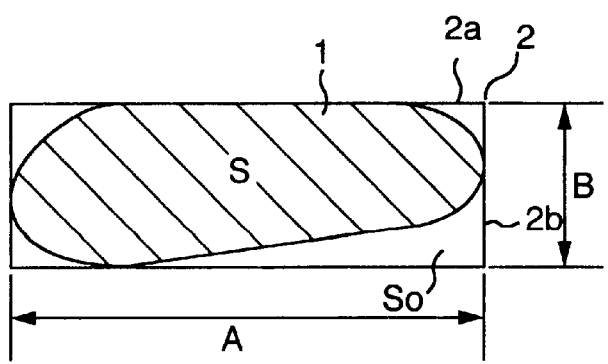
FIG. 2 is a schematic sectional diagram explaining a method of measuring the dimensions of the section of a flat glass fiber.

In the present specification, when a rectangle 2 circumscribed about the section of a flat glass fiber is imagined as shown in FIG. 2, the major axis and minor axis of the section of a highly flat glass fiber refer to the length A of the longer side 2a (corresponding to the longest dimension of the fiber section) and the length B of the shorter side 2b (corresponding to the longest dimension in the direction approximately rectangular to the major axis of the fiber section), respectively, of the above rectangle 2. The flatness ratio in this invention is represented by the ratio of the said major axis to the said minor axis, namely the longest major axis/the longest minor axis in the direction rectangular to the longest major axis (A/B).

Moreover, the reduced fiber diameter of the highly flat glass fiber refers to a value obtained by reducing the fiber diameter of the flat glass fiber to the fiber diameter of a circular cross-section glass fiber having a sectional area equal to the sectional area of the said flat glass fiber and is determined by calculation from the flat glass fiber weight per 1,000 m, the number of glass fibers composing the same and the density of the glass fiber per se or the area of the fiber section.

The composition of the highly flat glass fiber used in this invention may be such that glass fibers can be produced such as E glass, ECR glass, S glass, C glass, D glass and the like, and is not particularly limited.

It is necessary that the flatness ratio of the highly flat glass fiber used in this invention be 2.0 to 10. Here, when the highly flat glass fiber of this invention is used in the glass fiber nonwoven fabric, the flatness ratio is preferably 3.1 to 8, more preferably 3.1 to 5 and most preferably 3.5 to 4.5. When the flatness ratio is less than 3.1, the minor axis is large and hence the effect of making the nonwoven fabric thin and increasing the glass fiber content in the laminate is not sufficient. In addition, when the flat glass fiber is subjected to papermaking, such a phenomenon is easy to cause that the flat glass fibers accumulated on the net stand with the end in the major axis direction down and hence the bulk density becomes low, so that it is impossible to make the glass fiber content in the laminate equivalent to that of the glass cloth. On the other hand, when the flatness ratio becomes more than 8, such problems are caused that the draining time becomes too long in the papermaking and that the rate of impregnating the nonwoven fabric with a resin becomes low. In addition, the bulk density-increasing rate is low.

Furthermore, the highly flat glass fiber used in this invention has a packing fraction of at least 85%, preferably at least 90% and more preferably 93 to 89%. That is to say, when in FIG. 2, the sectional area of the glass fiber 1 is indicated as S and the area of the rectangle 2 is indicated as $S_0$, the packing fraction is preset so that the following is held:

Packing fraction (%)=$S \times 100/S_0 \geq 85$ (1) (incidentally, the section of the flat glass fiber 1 in FIG. 2 is merely for explaining the method of measuring the dimension and hence is not for the feature of this invention). For convenience of explanation, the "$S \times 100/S_0$" is hereinafter referred to as the packing fraction (%) below. When this packing fraction is preset as at least 85%, particularly at least 90% as in Equation (1), the section of the flat glass fiber comes to have a shape close to rectangle and the longer side thereof draws a straight line or a gentle convex or concave curve close to straight line. Accordingly, the flat glass fiber comes to have many substantially flat surfaces and when the flat glass fiber is subjected to papermaking, the flat glass fibers tend to be piled one on another with the substantially flat surfaces down. Therefore, it becomes possible to prepare a thin nonwoven fabric having a high packing density. At the same time, the piled flat glass fibers contact with one another at their substantially flat surfaces or become a very close state and a water-soluble binder or a binder dissolved in a solvent is kept in the spaces between the fibers and the bonding effect of the binder becomes very great. Therefore, in the production of a thin nonwoven fabric having a thickness of about 50 µm and an apparent amount of about 15 to 40 g/m², even when the amount of the binder used is as small as about 3 to 8% by weight, the strength necessary for the nonwoven fabric (for example, the strength required for preparing a prepreg in a subsequent step) can be ensured. In addition, the surface smoothness of the nonwoven fabric becomes good and simultaneously therewith the surface smoothness of the laminate in which the above nonwoven fabric is used becomes good. Incidentally, when the packing fraction is made larger than 98%, the section comes to have a shape substantially equal to rectangle, so that it becomes very difficult to prepare flat glass fibers having the above shape.

Figure 1:
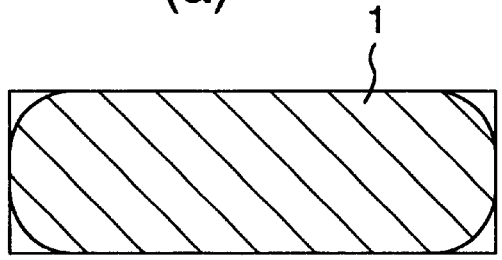
In FIG. 1, each of (a) and (b) is a schematic sectional diagram showing an example of the sectional shape of flat glass fiber used in this invention.
Figure 1:
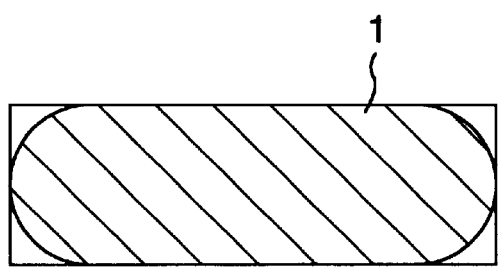

The flat glass fiber is prepared by extruding molten glass from nozzle chips having a flat-shaped nozzle hole and, at that time, solidifying the molten glass having a high viscosity drawn out of the nozzle chips while preventing the molten glass from forming a circular section. Therefore, the sectional shapes of the flat glass fibers, even when the glass fibers are spun from the same nozzle plate at the same time, are delicately varied depending upon the places of the nozzle chips and hence it is difficult to specify a critical shape. However, it can be defined substantially as follows. That is, the shape of the section of the flat glass fiber satisfying the above Equation (1) used in this invention is a rectangle whose four corners have been rounded off as shown by cross hatched area in FIG. 1(a), such an ellipse that a rectangle has a semicircle, a part of ellipse or a curved line close thereto at both ends, as shown by the cross hatched area in FIG. 1(b) or a composite shape of them. Incidentally, Numeral 1 in FIG. 1 refers to a highly flat glass fiber.

As to the thickness of the highly flat glass fiber of this invention, fibers having various fiber diameters can be produced by presetting the production conditions. However, those having a minor axis of 3 to 20 μm, preferably 4 to 15 μm and a longest major axis of 6 to 100 μm, preferably 15 to 80 μm are preferred for production. In other words, in the case of those having a minor axis of less than 3 μm, the spinning of glass fiber pre se is difficult and in the case of those having a major axis exceeding 100 μm, the flattening efficiency is bad and the rigidity is too high. Therefore, an efficient production is impossible.

Moreover, for a nonwoven fabric having a bulk density equivalent to that of a glass cloth, the highly flat glass fibers having a minor axis of 4 to 10 μm and a major axis of 15 to 40 μm are desirable.

Furthermore, the reduced fiber diameter of the highly flat glass fiber is 5 to 17 μm (minor axis B=about 2.8 to 9.6 μm), preferably 7 to 15 μm and more preferably 9 to 14 μm and such is suitable for the purpose of use in the glass fiber nonwoven fabric in this invention. When the reduced fiber diameter is less than 5 μm, economical spinning becomes difficult and since the fiber is too fine, the number of glass fibers per the same weight is increased, the bulk density of the nonwoven fabric becomes rather small, and it is difficult to obtain a laminate having a density close to that of a laminate in which a glass cloth using a conventional circular cross-section glass fiber is used. On the other hand, when the reduced fiber diameter exceeds 17 μm, the fiber becomes too thick and the rigidity is high, so that difficulties are caused in the orientation, dispersion and the like of fibers in the papermaking step. In addition, the number of fibers composing the nonwoven fabric becomes small. As a result, many spaces become present in the nonwoven fabric, the falling off of binder tends to be caused, and when a laminate is prepared, the surface smoothness thereof is inferior. Moreover, since the number of contact points of fibers with one another becomes small, it becomes necessary to increase the amount of the binder attached to ensure the strength.

The highly flat glass fiber of this invention can be used not only in the production of a glass fiber nonwoven fabric but also in various uses in which conventional glass fibers are used. In particular, in comparison with those in which conventional glass fibers are used, it is possible to make the content of glass fiber in products higher, and hence, various effects are obtained, for example, remarkable enhancement of various physical properties of not only nonwoven fabrics but also fiber-reinforced plastics prepared using a molding method such as injection molding, filament winding, hand lay-up molding, spray-up molding, resin-injection molding, pultrusion molding, press molding, continuous molding or the like; improvement in dimensional stability and surface smoothness; and the like.

Moreover, products having the same shapes as conventional glass fiber products can be produced and similarly to, for example, circular cross-section glass fibers, they can be used as products such as roving, chopped strand, milled fiber, chopped strand mat, roving cloth, glass cloth, yarn and the like. Further, various flat glass fibers can be produced and the production of flat glass fibers from acid resistant glass compositions having a large surface tension is also possible though said production has heretofore been difficult, and therefore, such new uses are developed that the acid resistance, corrosion resistance and gas barrier properties of FRP can be improved, and the like.

Process for Producing Highly Flat Glass Fiber

As for a process for producing the highly flat glass fiber of this invention, it can be produced by a production process not different from a method for producing a conventional glass fiber. That is to say, molten glass flowing out of a number of nozzle chips is first of all fiberized at a high speed, subsequently the handleability is made good, then a sizing agent or the like for protecting the glass fibers are applied thereto and the fibers are wound.

Glass yarns which are used in woven fabrics or the like are subjected to application of a heretofore known sizing agent in which the film-forming agent is of a starch type or a resin type, and then used as a warp or weft. Moreover, when they are used in paper or nonwoven fabric, they are treated with, for example, a surface active agent; a water-soluble film-forming agent and a silane-coupling agent; or the like.

In use in FRP and the like, to the glass fibers is attached the same known sizing agent as applied to conventional glass fibers which comprises, for example, a resin having a film-formability such as an epoxy resin, a urethane resin or the like; an antistatic agent such as a quaternary ammonium salt or the like; a silane-coupling agent such as γ-methacryloxypropyltrimethoxysilane, γ-glycidoxypropyltrimethoxysilane, γ-aminopropyltriethoxysilane or the like; etc, in an amount of 0.5 to 5% by weight based on the weight of the glass fibers depending upon the purpose, and the glass fibers are bundled.

The conditions for producing the glass fibers are variously different depending upon the composition, so that general conditions are explained using, as an example, the case of glass fibers composed of E glass composition. In general, glass fibers are prepared by extruding molten glass from a bushing in which a number of nozzle chips are formed. However, at this time, the molten glass in the bushing has a high temperature of about 1,200° C. and a viscosity of about 1,000 poises in the case of E glass. When modified cross-section glass fibers like the flat glass fiber are spun at a high speed from such molten glass having a low viscosity and a high surface tension, even if a non-circular cross-section nozzle chip is used as in, for example, JP-A-1(1989)-266, 937, the holes provided in the nozzle chips are too long and the resistance of the holes is too large for pulling the molten glass out of the holes, so that the amount of the outflow molten glass is reduced as compared with the nozzles provided in a plane nozzle plate free from the nozzle chips. When the length of the nozzle chip is made small, the cooling becomes insufficient and such a phenomenon is seen that the sectional shape of the product does not become stable. Moreover, it is necessary to make the hole area large and increase the amount of the molten glass fed in order to sufficiently increase the spinning speed. However, when the hole size is made large, the cooling of the glass is insufficient in this case and hence it becomes impossible to inhibit the glass from a tendency to round off owing to the surface tension. Thus, in the case of the conventional non-circular cross-section nozzle chip, it is difficult to obtain products having a desirable sectional shape when highly flat glass fibers are spun at a high speed, and a further improvement in nozzle chip shape has been required. That is to say, with the nozzle chips disclosed as the above-mentioned prior art, when flat glass fibers having a flatness ratio of at least 0.2 are spun at a speed as high as 1,500 m/min, there are such issues that broken fibers are often caused, and the sectional shape becomes instable. In particular, glass fibers having good acid resistance called ECR glass have a large surface tension and there are such issues that with conventional nozzle chips, it is impossible to produce flat glass fibers having a flatness ratio of at least 2.0 stably and with good productivity.

Nozzle Chips for Spinning Glass Fiber

On the other hand, the nozzle chips for spinning glass fibers of this invention have overcome the above-mentioned problems in the conventional nozzle chips and made it possible to produce highly flat glass fibers having a flatness ratio of 2.0 to 10 and a packing fraction of at least 85%, preferably at least 90%, at a high speed and stably.

That is to say, the nozzle chips for spinning glass fibers of this invention are those that the amount of the outflow molten glass and the sectional shape of the flat glass fiber in the high speed spinning have been stabilized by allowing the nozzle chips to be installed in a nozzle plate (a plate in which a number of nozzle chips are installed) to have such a shape that a part of the nozzle hole wall is notched or a glass reservoir portion is provided on the top of the said nozzle, and consist of the following constructions:

(1) A nozzle chip for spinning a flat glass fiber which comprises a protruded nozzle portion and a nozzle hole passing through the nozzle portion, characterized in that the said nozzle hole is composed of a pair of nozzle hole walls in the major axis direction and a pair of nozzle hole walls in the minor axis direction, the major axis/minor axis ratio of said nozzle hole is 2.0 to 10 and in one of the nozzle hole walls in the major axis direction is provided at the section a concave nozzle hole wall notch portion.

Figure 4:
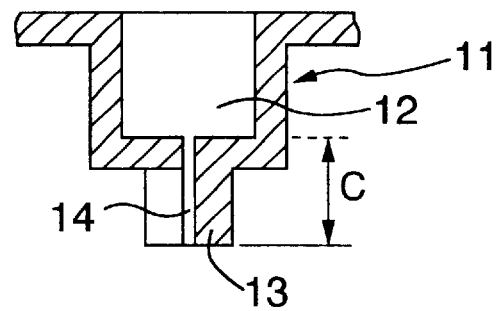
FIG. 4 is a longitudinal sectional view of FIG. 3 as to the line X–X'.

(2) The nozzle chip for spinning a highly flat glass fiber according to (1) above, wherein the depth of the notch in the above concave nozzle hole wall notch portion is 10% to 100% of the length of the protruded nozzle portion as shown in FIG. 4.

(3) The nozzle chip for spinning a highly flat glass fiber according to (1) or (2) above, characterized in that a molten glass reservoir whose molten glass inflow portion has an area 1.5 to 8 times the area of the above nozzle hole is provided on the top of the protruded nozzle portion.

Here, the appearance shape of the nozzle chip may be a cylindrical shape or the like as far as the desired nozzle chip hole can be provided; however, when the appearance shape is a rectangular parallelepiped or a shape similar thereto, many nozzle chips can be arranged in good order and densely in the nozzle plate having a limited area. The relation between the arrangement of nozzle chips and the winding means may be such that many nozzle chips arranged are directed in the same direction which is substantially parallel to the direction of the central axis of rotation of the winding means or they are arranged in a direction rectangular thereto. In addition, when the appearance shape is made simple, there is an advantage in that the production of the nozzle plate is not limited to a method of attaching the nozzle chips to the nozzle plate by welding, and there is such an advantage that the nozzle plate can be easily produced from a sheet of plate by a mechanical processing such as by a milling machine, an end mill or the like which are generally used; an electrical discharge processing; a press processing; or the like.

Figure 3:
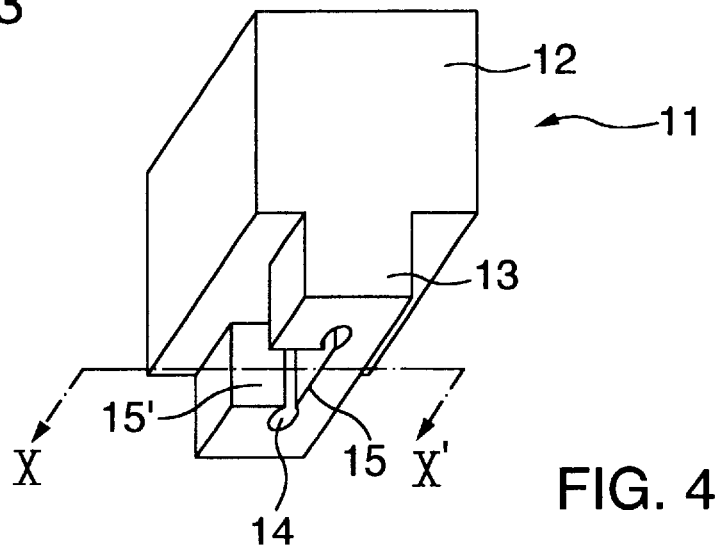
FIG. 3 is a perspective view showing one mode of the nozzle chip having a molten glass reservoir of this invention.
Figure 5:
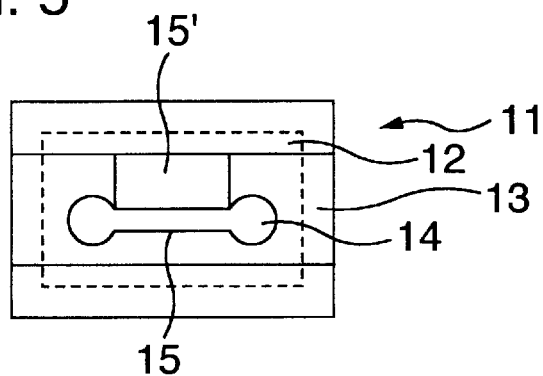
FIG. 5 is a plan viewed from below of the nozzle chip of FIG. 3.

Next, an outline is given of the structure of the nozzle chip for spinning a glass fiber used in this invention based on the drawings, and then the structure of each part is explained in detail together with its function. FIGS. 3, 4 and 5 are views showing an example of the nozzle chip for spinning a highly flat glass fiber relevant to this invention, FIG. 3 is a perspective view thereof, FIG. 4 is a sectional view thereof as to line X–X' and FIG. 5 is a plan viewed from below.

Figure 18:
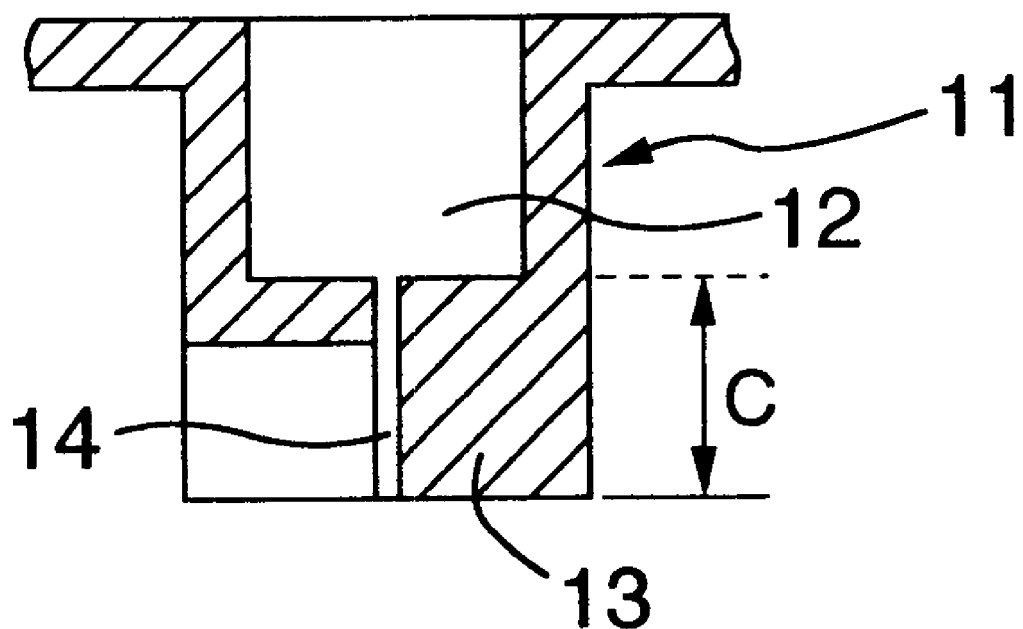
FIG. 18 is a sectional view showing another mode of the nozzle chip of this invention.

Incidentally, the sectional shape of the nozzle chip is not limited to an inverted ⌂letter shape as shown in FIG. 4 and may be a rectangular parallelepiped shape as shown in FIG. 18.

Figure 6:
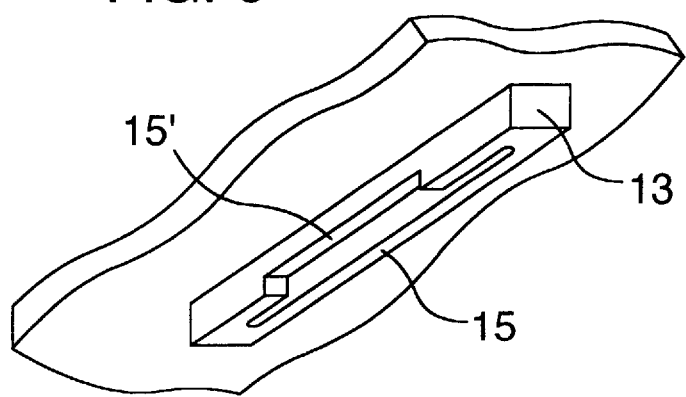
FIG. 6 is a perspective view of an example of the nozzle chip having no molten glass reservoir of this invention in which the length of the nozzle hole wall notch portion is not 100%. Here, 17 refers to a nozzle plate.

The nozzle chip 11 used in this invention has the protruded nozzle portion 13 which greatly affects the sectional shape of the flat glass fiber (hereinafter abbreviated as "the nozzle portion 13" in some cases). Here, the nozzle portion 13 before notching a part of the nozzle hole wall 15 is a nozzle chip having an opening portion of the same section as the nozzle 14. However, in the nozzle chip 11 of this invention, it is characterized that in one nozzle hole wall in the major axis direction of the pair of nozzle hole walls 15 in the major axis direction is provided at the section a concave nozzle hole wall notch portion 15'. Here, the "section" means the section of the nozzle hole wall 15 viewed from the direction perpendicular to the plane parallel to the major axis direction of the nozzle hole 14, and the "nozzle wall notch portion 15'" refers to the portion formed by notching the central portion of the nozzle hole wall 15 from the nozzle chip fore end direction. Accordingly, the nozzle hole wall in which the concave nozzle hole wall notch portion 15' is provided at the section has such a shape that the central portion has been notched, and the two end portions remain as shown in FIGS. 3 to 5. Accordingly, the nozzle chip of this invention includes also a nozzle chip having the structure that the nozzle portion 13 free from the molten glass reservoir portion is directly connected to the nozzle plate 17 (FIG. 6) or a nozzle chip having the structure that the molten glass reservoir 12 is provided on the top of the nozzle portion 13 (FIG. 18).

In the state that in the notched nozzle hole wall 15 on the major axis side, nothing remains at the two ends of the said nozzle hole wall 15, that is, in the state that the whole of one major axis side has become the nozzle hole wall notch portion 15', such a problem is caused that the major axis/minor axis ratio of the section of the product after spinning becomes much smaller than the major axis/minor axis ratio of the section of the molten glass just extruded from the nozzle chip and the flattening efficiency (the ratio of the flatness ratio of the flat glass fiber to the major axis/minor axis ratio of nozzle hole) is lowered. Accordingly, it is necessary to leave the two end portions of the nozzle hole wall 15 on the major axis side to such an extent that it is possible to hold the tendency of molten glass to round off in at least both end portions of nozzle chip.

By using the nozzle chip 11 having the structure of FIG. 3 that the molten glass reservoir portion 12 for stabilizing the flow of the molten glass and stabilizing the flat shape is provided in the above nozzle portion 13, it is possible to spin at a higher speed a glass fiber having a more stable sectional shape and a high flatness ratio. Moreover, when, in the nozzle chip arrangement in which many nozzle chips are arranged, a cooling fin is placed near the nozzle hole wall surface having the nozzle hole wall notch portion 15', there are obtained spinning conditions under which the flattening efficiency becomes at least 100%.

On the bottom of the nozzle chip is provided a nozzle hole 14 composed of a pair of nozzle hole walls in the major axis direction and a pair of nozzle hole walls in the minor axis direction. The shape thereof is a rectangle, a rectangle having semicircular shapes at both ends, a shape similar thereto, an elliptic shape, a dumbbell shape or a shape close thereto in order to obtain a highly flat modified cross-section glass fiber having a major axis/minor axis ratio, namely a flatness ratio, of 2.0 to 10, and the ratio of the longer side to the shorter side or the ratio of the longest major axis to the longest minor axis rectangular thereto is 2.0 to 10, preferably 3 to 8, in terms of the major axis/minor axis ratio. When the major axis/minor axis ratio is not more than 2, it is difficult to obtain a glass fiber having a flatness ratio of 2.0 to 10, and when the major axis/minor axis ratio is not less than 10, the sectional shape of the fiber tends to become instable and efficient production is difficult.

The longest minor axis of the nozzle hole 14 is desirably at least 0.5 mm, preferably at least 0.8 mm though it is controlled so as to match to the kind of molten glass and the production. When the longest minor axis is less than 0.5 mm, the effluence of the molten glass is not satisfactory and the change in dimension of fiber is large, which is not desirable. The length C of the nozzle hole is preferably 1 to 6 mm, more preferably 1 to 4 mm. Moreover, it is necessary that the fore end of the nozzle chip protrude at least 0.2 mm from the nozzle plate surface. When the protrusion height of the nozzle chip 11 from the lower surface of the nozzle plate is small, the cooling effect is not clear and when it is too large the cooling effect is too much and the viscosity of the glass is increased and tends to become inappropriate to fiberization of the flat glass fiber.

As stated above, in order to stabilize the flow of the molten glass and stabilize the flat shape, the molten glass reservoir 12 may be provided on the top of the nozzle hole 14 of the nozzle chip 11. It is desirable that the sectional area thereof, namely the area of the molten glass inflow portion, is 1.5 to 8 times, preferably 2 to 5 times, the area of the nozzle hole 14. This is because when the sectional area is not more than 1.5 times, the difference from the conventional nozzle chip which is straight and free from the glass reservoir portion is small, and when the sectional area is at least 8 times, a dead zone is formed in the glass reservoir and a highly viscous molten glass tends to be formed, whereby not only the stabilization of spinning and the stabilization of sectional shape of flat fiber are adversely affected, but also the sectional area of the nozzle chip having the glass reservoir becomes large, the number of nozzle chips which can be placed in the same area becomes small, and the amount of the highly flat glass fiber produced is decreased.

In the case of a nozzle chip for spinning a circular cross-section glass fiber wherein a glass reservoir portion is provided on the top of the nozzle hole of the nozzle chip, a cylindrical or conical reservoir is generally provided. However, in this invention, in order to increase the viscosity of the molten glass in a portion near the wall surface by the cooling effect to improve the flattening efficiency and simultaneously in order to adapt the distribution of the flow rate to the sectional shape to be produced because the major axis of the nozzle hole is long, in case the nozzle hole has, for example, an elliptic section, the shape of the inflow hole is made similar to the orifice diameter in some cases; however, the cooling and flowing of the glass in the nozzle chip can be controlled by changing the shape of the reservoir to a rectangular shape, a dumbbell shape or the like.

The sectional shape of the molten glass reservoir portion includes such that the shape of the liquid inlet extends straight down to just above the nozzle hole and such a tapering shape that the inlet and the nozzle hole are connected through a smooth plane having substantially no step.

The area of the molten glass reservoir portion 12 is larger than the sectional area of opening of the nozzle 13 and it can be provided to such an extent that the installation of adjacent nozzle chips is not affected. The depth is determined from the total length of the nozzle chip 11 and the length of the nozzle hole 14 portion considering the degree of cooling the molten glass and the turbulence of flow. The depth is from 0 mm to 2 times, desirably 1 to 2 times, the thickness of the nozzle plate. When the depth is small, the effect is a little and when the depth is too large, the cooling becomes too much, so that the amount of the molten glass extruded from the nozzle chip tends to decrease and the sectional shape of the flat glass fiber tends to become instable.

Moreover, in order to hold the force that the molten glass pulled out of the nozzle hole rounds off by surface tension, it is effective for more stabilizing the flat sectional shape that on the fore end surface of the minor axis portion nozzle hole wall at both ends of the nozzle portion 13 is provided a concave shape groove having a width not exceeding the largest width of the minor axis of the nozzle hole 14 and a depth of 0.1 to 0.7 mm or that on both end portions of the major axis of the nozzle hole is provided convex edges having a height of 0.1 to 0.7 mm face to face by extending the minor axis portion or in contact with the minor axis portion.

Specific shapes and dimensions of the molten glass reservoir portion 12, specific dimensions of the major axis and minor axis and shapes of the nozzle hole 14, and the like are appropriately determined based on experience and experiment because they are varied greatly depending upon the thickness of the nozzle hole wall 15; the kind of the molten glass; the spinning conditions including spinning temperature, glass fiber-winding speed, flatness ratio of the flat glass fiber produced, reduced fiber diameter and the like; and the product quality.

This invention enables the stabilization of the sectional shape and the spinning at a high speed by subjecting the nozzle portion 13 provided on the bottom of the nozzle chip 11 to a suitable processing for holding the force that the molten glass pulled out of the nozzle rounds off by surface tension.

As to specific shapes, the length (width) of the nozzle hole wall notch portion 15', together with the height of the notch portion 15', has such an effect as to increase the surface tension of the molten glass and increase the flatness ratio; however, considering various elements such as the melting temperature of glass, the glass fiber-spinning speed, the stability of flatness ratio and the like, said effect is exerted by notching a portion of 30% to 100%, preferably 40 to 90% and most preferably 50 to 80%, of the nozzle hole wall length in the major axis direction. When it is less than 30%, the notching effect is a little, and when 100% of the length is notched and the shorter side portion is made not more than ½, supercooling is caused and the flattening efficiency becomes bad. Moreover, the length of the major axis is varied sharply depending upon the winding speed in spinning, the production, the flattening efficiency and the like, but the major axis does not exceed a width of 15 mm. In addition, when plural minor axes of the nozzle hole exist in one nozzle chip, the smallest numerical value is used as the minor axis of the nozzle.

Furthermore, the depth of the notch in the above concave nozzle wall notch portion 15' is preferably 10% to 100%, more preferably 30% to 80%, of the length of the protruded nozzle portion 13. Incidentally, in this case, the "length of the protruded nozzle portion" means, when the nozzle chip has the molten glass reservoir portion, the length of the nozzle hole in the protruded portion obtained by subtracting the phantom smallest nozzle length of 0.3 mm from the nozzle length C, or means, when the nozzle chip has no molten glass reservoir portion, the length of the nozzle hole in the protruded portion. In addition, the protruded portion refers to the portion protruded from the lower surface of the nozzle plate. When the depth is 10% or less, the notching effect is a little and the notching of at least 0.2 mm is necessary.

Figure 7:
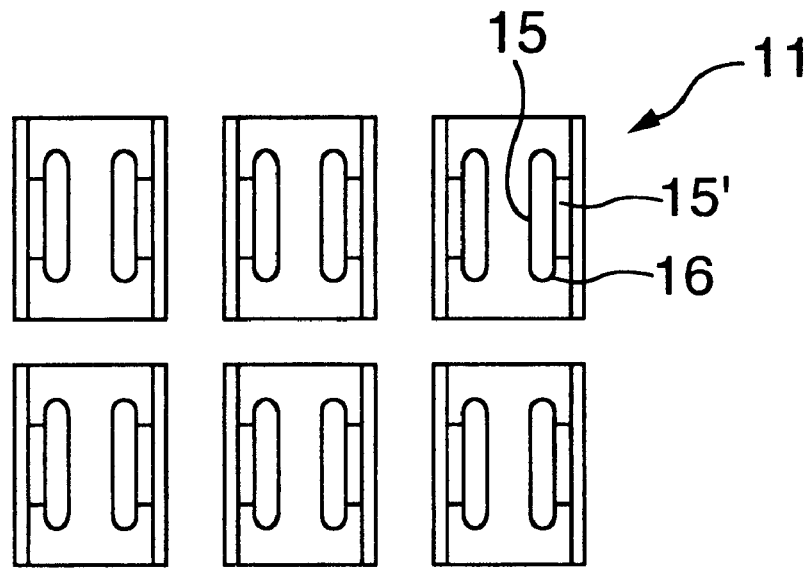
FIG. 7 is a plan viewed from below of a nozzle chip for spinning highly flat glass fibers wherein in the nozzle hole wall on the nozzle chip wall side of the nozzle hole walls in this major axis direction is provided at the section a concave nozzle hole wall notch portion, and each of the nozzle holes is placed so that the nozzle hole walls in the major axis direction which do not have at the section the nozzle hole wall notch portion are mutually continued.
Figure 8:
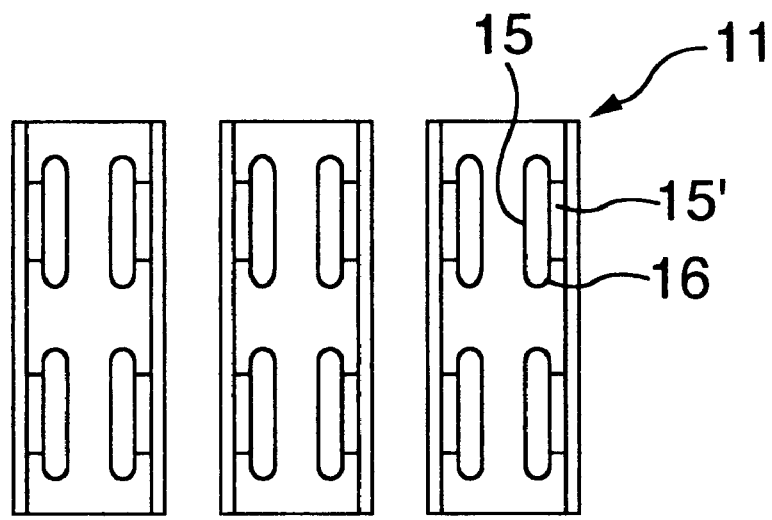
FIG. 8 is a nozzle chip in which two nozzle chips of FIG. 7 are connected (having two sets of nozzle holes) and no space is present between the two nozzle chips. Therefore, the nozzle can be miniaturized. The larger the number of the connected chips, the greater this effect becomes.

Moreover, in this invention, it is also possible to use a nozzle chip for spinning a highly flat glass fiber (see FIG. 7 and FIG. 8) which comprises a protruded nozzle portion and at least one set of nozzle holes passing through the said nozzle portion, characterized in that the said nozzle hole is composed of a pair of nozzle hole walls in the major axis direction and a pair of nozzle hole walls in the minor axis direction; in the nozzle hole wall on the nozzle chip wall side of the nozzle hole walls in the major axis direction is provided at the section a concave nozzle hole wall notch portion; and each nozzle hole is placed so that the nozzle hole walls in the major axis direction which do not have at the section the concave nozzle hole wall notch portion are mutually continued. FIG. 7 shows a nozzle chip in which a pair of nozzle holes are placed and FIG. 8 shows a nozzle chip in which two pairs of nozzle holes are placed.

Process for Placing Nozzle Chips for Spinning Flat Glass Fiber and Apparatus for Producing Flat Glass Fiber As stated above, when a nozzle chip for spinning a glass fiber in which in one of the nozzle hole walls in the major axis direction is provided at the section a concave nozzle hole wall notch portion is used, it becomes possible to produce the highly flat glass fiber at a high speed. With the conventional nozzle for producing flat glass fiber, a cold wind is allowed to blow against the nozzle for quenching the molten glass, which flows out in the flat shape, to form a glass fiber having a large flatness ratio. However, the nozzle having provided therein the notch portion according to this invention has a high cooling effect, and when the conventional cooling with a cold wind is conducted, the cooling rate is so high that the production of fine fiber is difficult. Furthermore, when the amount of air is reduced or the flatness ratio of the spun fiber is made large, an uneven portion is caused in the flow of air and the flatness ratio of a product tends to be greatly varied, and hence, it has been necessary to conduct the spinning with exerting some ingenuity to the cooling method.

Therefore, an examination has been made of the use of a cooling fin which has been used in the production of the conventional circular cross-section glass fiber and which is less in the cooling effect than with a cold wind to find that when the cooling fin is placed between the nozzles in parallel to the major axes of the nozzles (see FIG. 12), the flattening efficiency is enhanced and the spinning state is stabilized, and to confirm that the cooling fin can be used in the production of the flat glass fiber.

Figure 15:
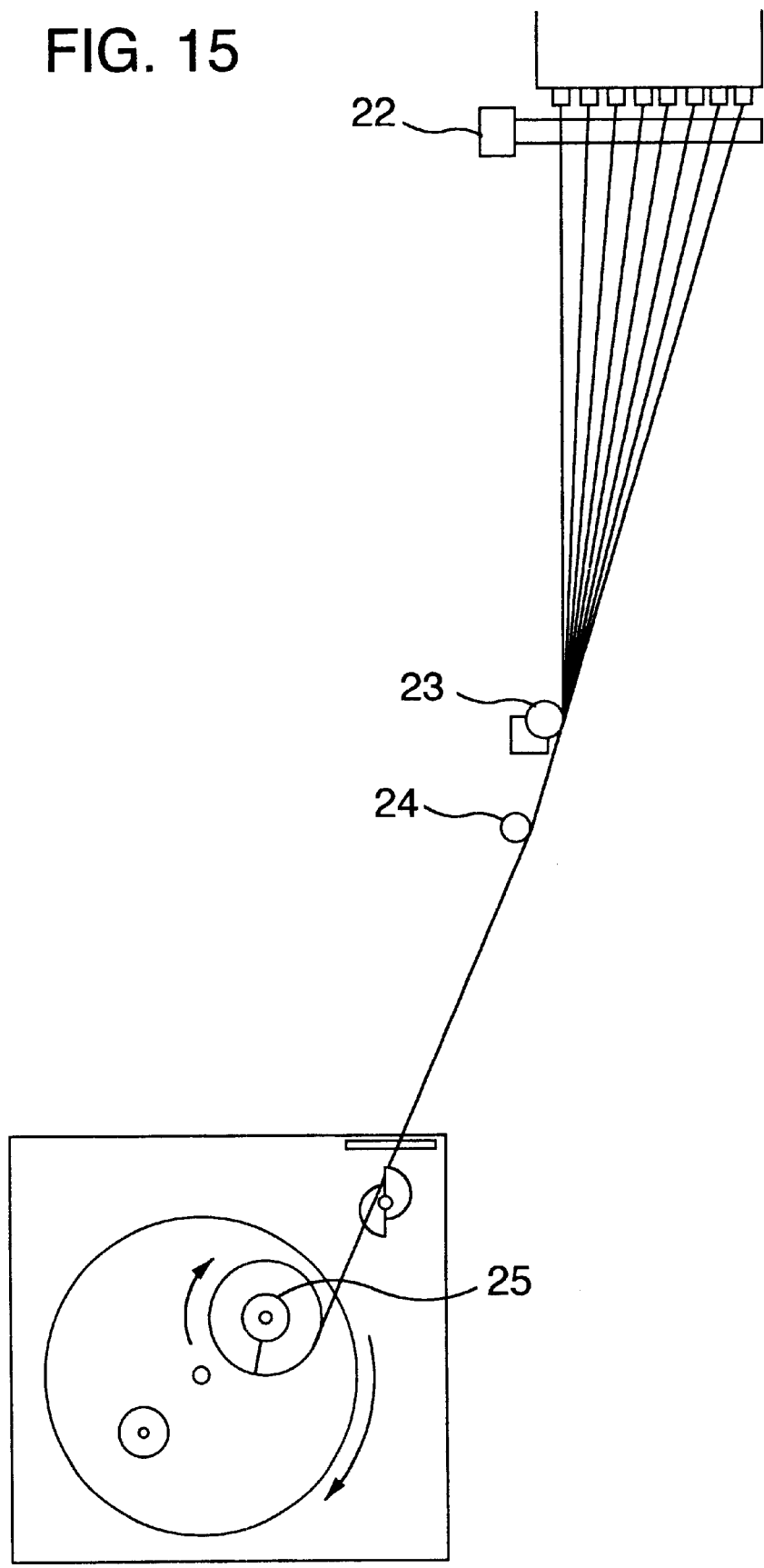
FIG. 15 is a schematic front diagram of spinning apparatus in which the nozzle plate of this invention is used. Here, 22 refers to a water-cooling portion, 23 to a binder applicator, 24 to a gathering shoe and 25 to a winder.

In spinning a flat glass fiber, a sizing agent is applied by an applicator to the modified cross-section glass fibers spun through spinning nozzle chips in which the notch portion is parallel to the longitudinal direction of the nozzle plate as shown in FIG. 15 while the fibers are gathered into one or plural bundles, and then wound. At this time, in order to facilitate the attachment of the sizing agent to the fibers by contacting the face of the longer side of the modified cross-section fiber with the surface of a coating means such as a roller, a wide belt or the like to which surface the sizing agent has been attached, the longer sides of the spun fibers and the rotation axis of the roller or the like of the binder applicator are placed in parallel. Therefore, the whole of the spinning apparatus is constructed so that the direction of the rotation axis of a winder for winding the spun glass fibers, the direction of the rotation axis of the binder applicator of a roller-shaped or belt-shaped applicator for applying the sizing agent, the major axis direction of the nozzle chip, and the longitudinal direction of the nozzle plate are all placed substantially in parallel (see FIG. 15 and FIG. 17).

Figure 17:
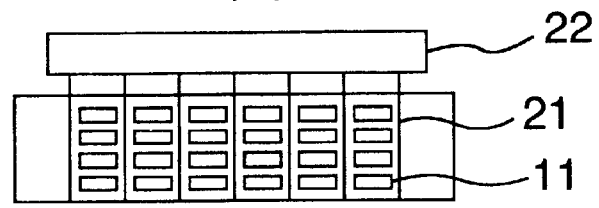
In FIG. 17, (a) is a plan viewed from below explaining the relation between the nozzle plate and cooling fins, (b) is a front view of the essential part of the spinning apparatus using this, and (c) is an explanatory view of the flow of the molten glass from nozzle chips in the center and end portions of the nozzle plate.
Figure 17:
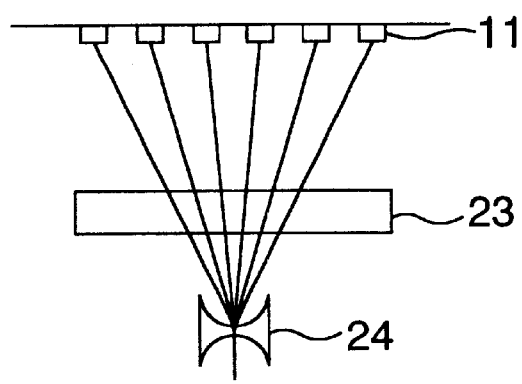
Figure 17:
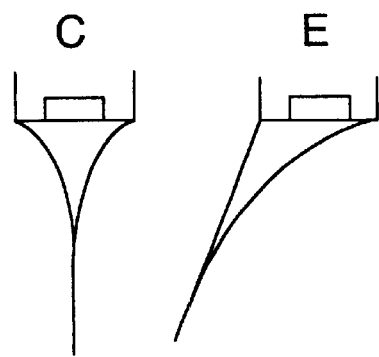

The spun glass fibers are gathered at the center portion as shown in FIG. 17 and hence the glass fiber pulled out of the spinning nozzle chips placed at both end portions of the nozzle plate in the longitudinal direction are pulled down obliquely below along the longer side and stretched. As a result, the flatness ratio becomes small and such a problem has been caused that the flatness ratios of the glass fibers produced through the nozzle chips at the center and end portions become different.

Figure 11:
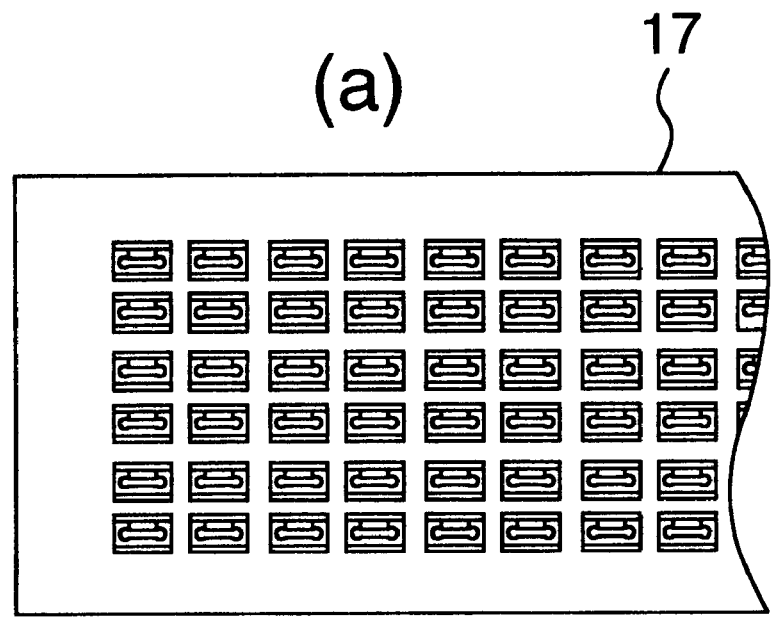
In FIG. 11, (a) is a cutaway plan viewed from below of an example of the nozzle plate in which the notch portion is parallel to the longitudinal direction and (b) is a partial enlarged view explaining the arrangement relation thereof.
Figure 11:
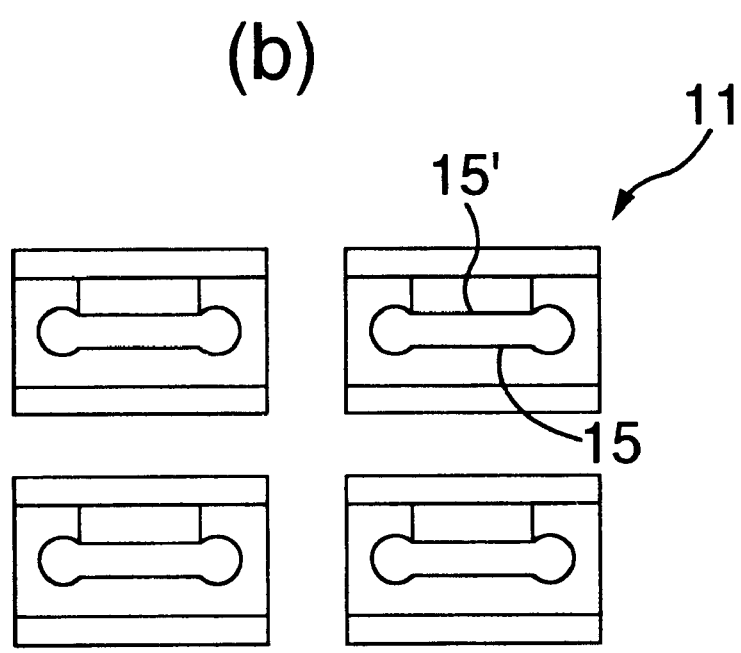

Moreover, in order to effectively cool the nozzle chips on the nozzle plate, it is effective to cool the notched nozzle hole wall surface having a large area; however, in the conventional nozzle chip placement shown in FIG. 11 in which the notch portions are arranged in parallel to the longitudinal direction of the nozzle plate, the length of the nozzle chip arrangement is large and hence it is unavoidable that the length of the cooling fin becomes inevitably long. As a result, the conventional cooling fin is lacking in ability and the degree of cooling is varied depending upon the place. Consequently, there has been such problems that when the cooling is proper, the flatness ratio is large, the flatness ratio of the glass fiber spun through the nozzle chips in which cooling is insufficient becomes small, and the variation of flatness ratio in one and same glass fiber bundle becomes larger.

Therefore, in view of such problems, this invention aims at providing a nozzle chip for spinning a glass fiber which can produce a glass fiber having a high flatness ratio with good quality and good productivity, by arranging the major axis directions of spinning nozzle chips rectangularly to the longitudinal direction of the nozzle plate, namely in parallel to the width direction, shortening the length of cooling fins to reduce the difference in cooling effects between the fore end and the base portion of the fin, thereby diminishing the variation of flatness ratio of the glass fiber obtained, and in addition, arranging each nozzle chip on the nozzle plate so that all the nozzle hole wall surfaces having provided thereon the concave nozzle hole wall notch portions face one another, and placing the cooling fins between the nozzle chips to make large the temperature difference between the notch portion and the protruded portion of the remaining wall, and also aims at providing a process for placing the nozzle chips for said purpose.

According to the conventional cooling method using cooling fins, it has been considered that the enhancement of productivity be limited. However, the present inventors have paid their attention to the fact that the cooling fin has such advantages that the difference in cooling effect depending upon the place is small, a stabilized quality product can be obtained and even maintenance and inspection are easy, and have made various examinations of a method of effectively utilizing the above advantages.

As a result, the present inventors have found that the above problems can be solved by shortening the length of the nozzle chip row by arranging the longer sides of the nozzle chips rectangularly to the longitudinal direction of the nozzle plate, in other words, in parallel to the axis of the width direction, for achieving the above-mentioned purposes, thereby making the effect of the cooling fin even, and accelerating the cooling of the notch portions, and further that the above problems can be more effectively solved by thermally insulating the nozzle hall wall surface portion in which the concave nozzle hole wall notch portion is not present, and further have made various examinations of the positions of the notch surface of the nozzle chip and the cooling means and the shape of the nozzle chip.

Figure 13:
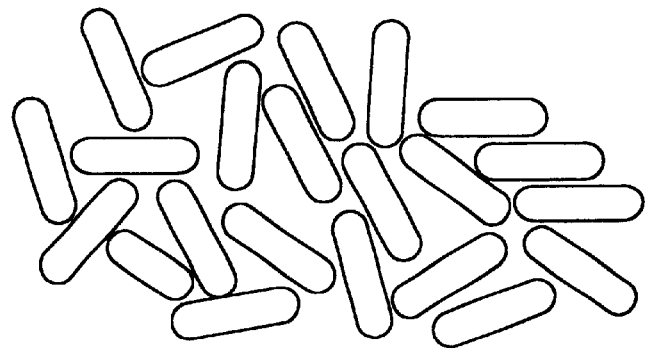
FIG. 13 is a phantom view of the heretofore supposed state that flat glass fibers spun using the nozzle plate of this invention are bundled at random.
Figure 14:
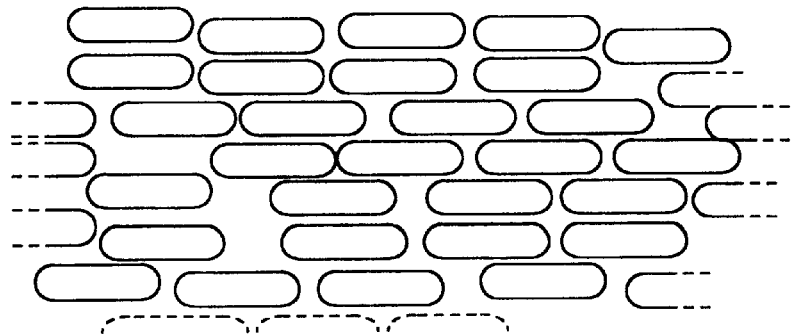
FIG. 14 is a partial enlarged view of the state that the flat glass fibers spun using the nozzle plate of this invention have actually been bundled.

It has heretofore been considered that when as in this invention, it is intended to produce a glass fiber using the nozzle plate in which the longer sides of the nozzle chips are arranged in parallel to the width direction of the nozzle plate (see FIG. 9 and FIG. 10), the flat glass extruded from the nozzle chips is stretched and contacted as it is with the coating means surface in the state that the glass stands rectangularly to the surface and thereafter it falls down at random in any of the left and right directions, so that as shown in FIG. 13, the fibers are gathered at various angles into a glass fiber bundle in which many spaces exist. Therefore, such a nozzle chip arrangement has not been adopted. However, by a trial manufacture by the present inventors, it has been found that even when spinning is effected using apparatus in which the longer sides of the nozzle chips are arranged in parallel to the longitudinal direction of the nozzle plate or using apparatus in which they are arranged rectangularly to the longitudinal direction of the nozzle plate, the winding result has surprisingly been such that there is no difference in the fiber-arranged state between the two and that in the resulting fiber bundle, flat fibers are arranged in the same direction with small spaces (see FIG. 14). It cannot be clearly confirmed how the fibers in the resulting fiber bundle have changed their arrangement in the steps of from spinning to winding; however, since between the above two cases, there is substantially no difference in the manner of fiber arrangement, it is inferred that perhaps when the molten glass extruded from the nozzle chips is stretched and contacted with the surface of the binder applicator, the fibers are arranged evenly on the surface.

Figure 9:
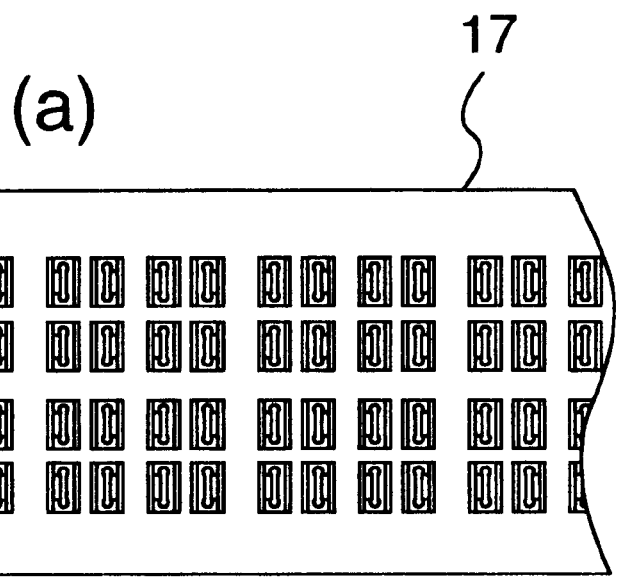
In FIG. 9, (a) is a cutaway plan viewed from below of an example of the nozzle plate of this invention and (b) is a partial enlarged view explaining the arrangement relation of the nozzle chips thereon. A cooling fin is placed between the notch portions facing each other.
Figure 9:
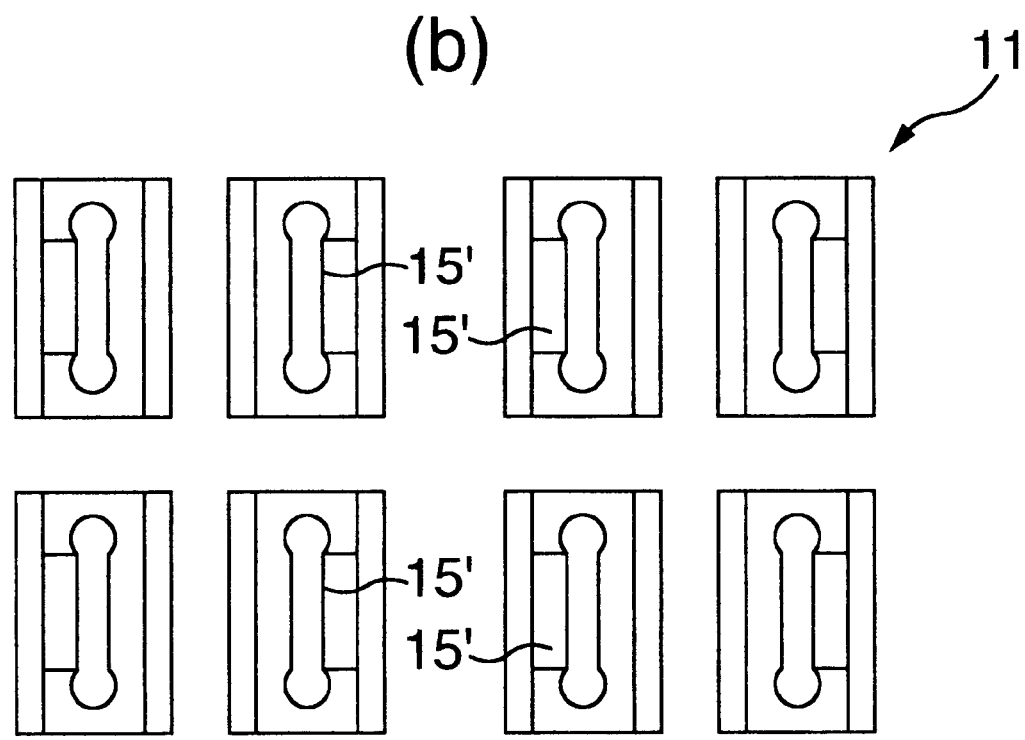
Figure 10:
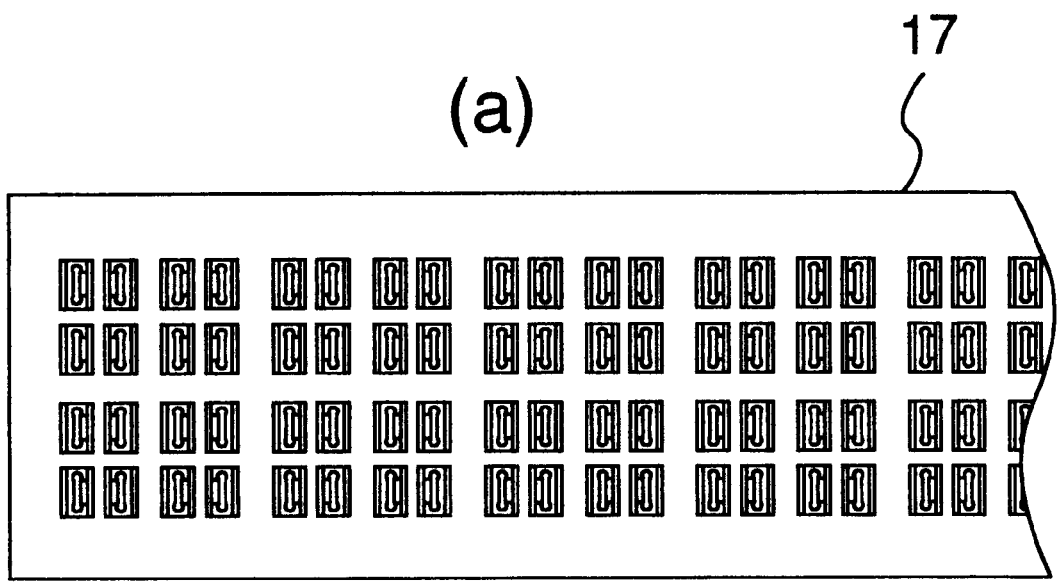
In FIG. 10, (a) is a cutaway plan viewed from below of another example of the nozzle plate of this invention and (b) is a partial enlarged view explaining the arrangement relation of the nozzle chip wall portions thereon. A cooling fin is placed between the nozzle wall surfaces facing each other.
Figure 10:
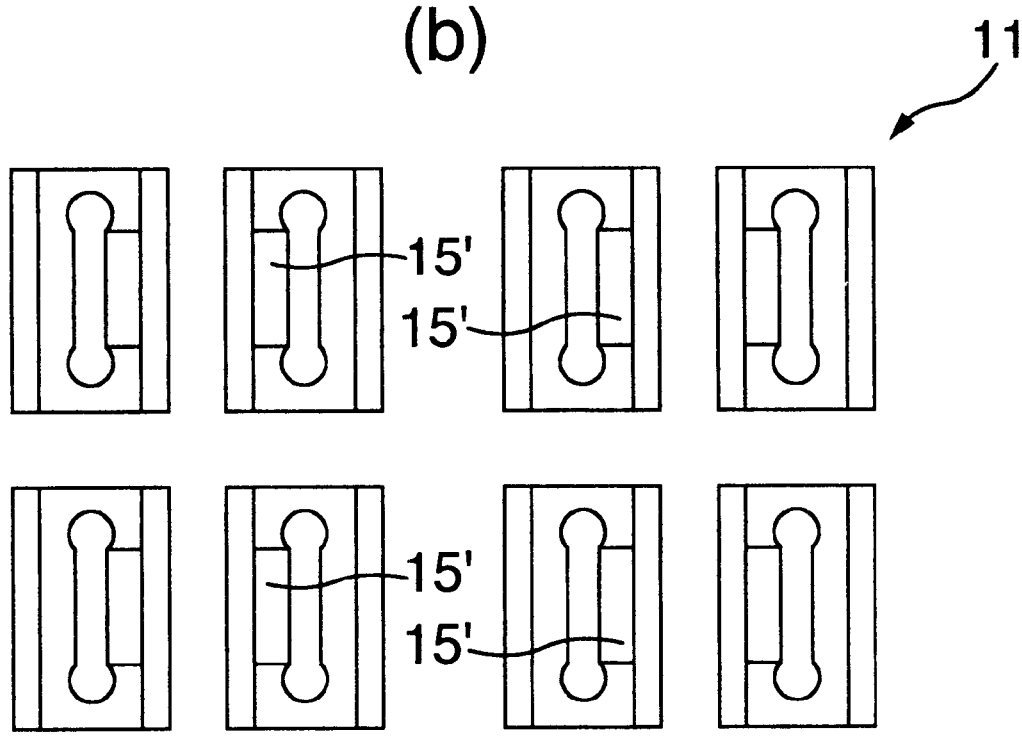

Since it has become possible to arrange the nozzle chips as mentioned above, it becomes possible to shorten the cooling fins to be placed on the surface, so that the unevenness of the cooling effect between the fore end and the base portion of the fin is diminished, and a considerably satisfactory result is obtained about the variation of flatness ratio of the fibers obtained. When cooling fins are placed between the nozzle chips shown in FIG. 3 which are placed in lines directing all the notch portions 15' of the nozzle chips in one direction, one side of the cooling fin faces the nozzle hole wall surface having provided thereon the notch portion 15' and the other side faces the nozzle hole wall surface free from the notch portion 15'. In a cooling method with such a placement, the difference in cooling becomes small between the nozzle hole wall surface having provided thereon the notch portion 15' and the nozzle hole wall surface free from the notch portion 15', but a fiber having a considerably satisfactory flatness ratio is obtained. In addition, as shown in FIG. 9, when the nozzle chips are arranged so that the nozzle hole wall surfaces having provided thereon the concave nozzle hole wall notch portions face one another and the cooling fins are placed between them, the flattening efficiency, the packing fraction and the like are enhanced. Moreover, when the cooling effect of the notch portion is too much and fiber cutting is caused, the nozzle chips can be arranged contrary thereto so that as shown in FIG. 10, the nozzle hole wall surfaces free from the notch portion face one another and the cooling fins are placed between them.

That is to say, the nozzle plate 17 of this invention is characterized in that the nozzle chips for spinning a flat glass fiber are placed on the nozzle plate 17 so that the major axis direction of the nozzle chip is rectangular to the longitudinal direction of the nozzle plate 17, and it is preferable that the longitudinal direction of the nozzle plate 17 is placed in the position parallel to the rotation axis of the binder applicator 23 and/or the rotation axis of the winder 25 (see FIG. 15). Further, the apparatus for producing the highly flat glass fiber in this invention is characterized in that in the step of spinning a flat glass fiber through nozzle chips having a notch portion on one of the longer sides of the nozzle chip wall portion, cooling fins are placed between the nozzle rows (see FIG. 12).

The above-mentioned mode for carrying out this invention is explained referring to the drawings. The shape of the molten glass outflow portion in the nozzle chip used in this invention means one having a major axis and a minor axis such as a rectangular shape, a dumbbell shape, a cocoon shape, an egg shape or the like.

Figure 16:
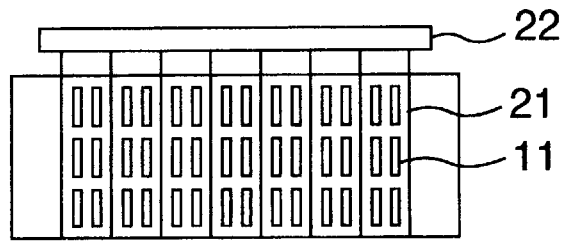
In FIG. 16, (a) is a plan viewed from below explaining the relation between the nozzle plate of this invention and cooling fins, (b) is a front view of the essential part of the spinning apparatus using this, and (c) is an explanatory view of the flow of the molten glass from the nozzle chips in the center and end portions of the nozzle plate.
Figure 16:
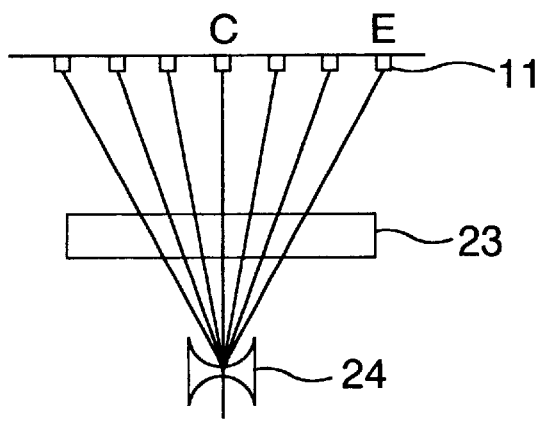
Figure 16:
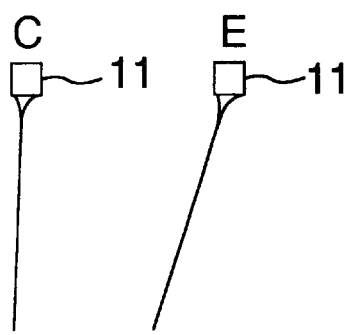

In this invention, the nozzle plate is placed in the position that its longitudinal direction becomes parallel to the rotation axes of the binder applicator and winder and the major axis direction of the nozzle chip is rectangular to the longitudinal direction of the nozzle plate, so that the row of the nozzle chips arranged in the major axis direction becomes short. Therefore, the spun glass fibers are gathered in the direction from the shorter side of each nozzle chip to the center portion of the nozzle plate as shown in FIG. 16, so that such a result is obtained that the difference in flatness ratio between the glass fiber from the nozzle chip at the center portion and the glass fiber from the nozzle chip at the end portion becomes relatively small.

In the spinning of the nozzle chip 11, the heat dissipation from the nozzle hole wall notch portion 15' is large, while the nozzle hole wall 15 free from the nozzle hole wall notch portion 15' had better be heat-insulated. The reason therefor is that when the heat dissipation from the nozzle hole wall notch portion 15' is increased to lower the temperature of the molten glass on the surface, the surface tension becomes small, the glass moves so that it is pasted on the nozzle hole wall surface 16 left without being notched in the nozzle hole wall 15 having the nozzle hole wall notch portion 15', and the molten glass flowing on the high temperature nozzle hole wall 15 free from the notch portion 15' and on the high temperature nozzle hole wall surface 16 left without being notched wets the end portions of the major axis and spreads thereover, so that by pulling the molten glass, the stretching is completed with a little change of the sectional shape.

In order to bring about such a state, in this invention, as illustrated by FIG. 9, the nozzle chips are arranged so that the nozzle hole walls having provided thereon the concave nozzle hole wall notch portions face one another. As a result, the nozzle chip placement becomes such a style that the nozzle hole wall notch surfaces 15' face one another and the nozzle hole walls 15 free from the notch portion 15' face one another. It is particularly preferable to form such a structure that cooling fins 5 are placed between the nozzle hole wall notch surfaces 15' facing one another in the many nozzle chip rows placed in this manner and the cooling fins 21 are not placed between the notch portion 15'-free nozzle hole walls 15 facing one another as shown in FIG. 7.

However, the cooling effect is, in some cases, too much owing to a difference in composition or in molten glass temperature or the like, and in such cases, spinning is effected in such a state that the surfaces having the notch portion are placed facing one another as shown in FIG. 10 and air-cooling fins are placed between the rows in which the notch-free surfaces face one another, whereby the desired flat glass fiber can be obtained. Since it is not necessary to place the air-cooling fin between the nozzle hole walls 15 free from the notch portion 15' as shown in FIG. 9 and between the nozzle hole walls 15 having the notch portion 15' as shown in FIG. 10, the distance between the nozzle rows can be narrowed as much.

Further, in this case, when the above-mentioned (4) nozzle chip for spinning a highly flat glass fiber (see FIG. 7 and FIG. 8) is used which comprises a protruded nozzle portion and at least one set of nozzle holes passing through the nozzle portion and which is characterized in that the said nozzle hole is composed of a pair of nozzle hole walls in the major axis direction and a pair of nozzle hole walls in the minor axis direction; in the nozzle hole wall on the nozzle chip wall side of the nozzle hole walls in the major axis direction is provided at the section a concave nozzle hole wall notch portion; and each nozzle hole is placed so that the nozzle hole walls in the major axis direction which to not have at the section the concave nozzle hole wall notch portion are mutually continued, the shape can be made more compact.

Glass Fiber Nonwoven Fabric

The glass fiber nonwoven fabric of this invention is prepared by using the highly flat glass fiber of above-mentioned characteristics; however, in this case, all the fibers constructing the nonwoven fabric may be the highly flat fibers of the above-mentioned characteristics, or may, if necessary, be used in admixture with other fibers, for example, a circular cross-section glass fiber. When they are used in admixture with other fibers, in order to effectively exert the effect of the flat glass fiber of the above-mentioned characteristics, the amount of the flat glass fiber used should be at least 90% of the total weight of the nonwoven fabric excluding the binder.

The flat glass fibers to be used in the glass fiber nonwoven fabric of this invention may be those having the same characteristics (flatness ratio, reduced fiber diameter and the like are the same) or may be a blend of those having different characteristics. When the blend is used, it is preferable to use a blend of two kinds of fibers having different reduced fiber diameters. For example, it is preferable to use two such kinds of flat glass fibers that their reduced fiber diameters are different by 5–10 μm at a blend ratio of 90–50% by weight of a flat glass fiber having a large reduced fiber diameter to 10–50% by weight of a flat glass fiber having a small reduced fiber diameter. When the blend of the two kinds of fibers different in reduced fiber diameter is used, the bulk density is made much higher by the effect of filling with the fine fibers the spaces formed in the nonwoven fabric composed of the thick fibers, and since the flat glass fibers are arranged on the surface, the irregularities are a few.

Therefore, the smoothness of a laminate in which the above glass fiber nonwoven fabric is used in the surface layer becomes very high.

In the glass fiber nonwoven fabric of this invention, the amount of the binder used for fixing the glass fibers is adjusted to 3 to 8% by weight. When this amount of the binder is less than 3% by weight, the adhesion of the glass fibers to one another becomes insufficient and it becomes difficult to ensure the tensile strength necessary for the nonwoven fabric. On the other hand, when the amount of the fiber becomes larger than 8% by weight, the binder affects adversely the heat resistance, hot water resistance and water resistance of the laminate prepared using the glass fiber nonwoven fabric to deteriorate the performance of the laminate.

The glass fiber nonwoven fabric of this invention can be prepared by the following method. First of all, the molten glass is stretched by the above-mentioned method or the like and simultaneously therewith cooled and solidified in the state that the flat shape is kept, and subsequently, the resulting fibers are immediately coated with a sizing agent by, for example, a known binder applicator such as a roller applicator or the like and then gathered into a strand.

As the sizing agent, for facilitating the dispersion of the glass fibers in water, there are used, for example, water-soluble high polymers such as polyvinyl alcohol, polyethylene oxide, water-soluble epoxy resin and the like or mixtures of them with cationic surface active agents; or there are used surface active agents and lubricants alone, and the sizing agent is applied to the glass fiber in a proportion of 0.05 to 0.5% by weight in terms of solid content. Into the composition of the sizing agent can be incorporated a known component for improving the adhesiveness between the fiber and the matrix resin such as silane-coupling agent or the like. The composition of the above sizing agent may be a known composition used in the production of a glass fiber nonwoven fabric by a wet type papermaking method and the same paper-making as before can be effected without using any special one.

This strand is cut to a length of 3 to 25 mm to form a chopped strand, and thereafter, a nonwoven fabric is prepared by a wet type nonwoven fabric-making method.

In the course of this wet type nonwoven fabric-making, a heretofore known method for producing a glass fiber nonwoven fabric (or a glass paper) is used, and the nonwoven fabric is produced in the same manner as in the case of using a circular cross-section glass fiber in which manner, for example, a dispersing agent and, if necessary, a binder and the like are added to a large amount of water and then the glass fiber chopped strands are introduced thereinto and dispersed in water in the form of a filament by the dispersion mechanism of a pulper or the like.

The liquid in which the glass fibers are dispersed is subjected to dehydration by a paper machine, the glass fibers obtained are coated with a binder such as an epoxy resin or the like by a spraying means or the like, and thereafter, subjected to control of the attachment of the binder, dried and wound in roll. Alternatively, a powdery epoxy resin, a water-dispersible epoxy resin or a modified epoxy resin is previously added to the glass fiber dispersion and, after the papermaking, the epoxy resin is dried or cured to impart a strength as a nonwoven fabric. As mentioned above, the glass fiber nonwoven fabric can be produced.

The glass fiber nonwoven fabric of this invention is used as an intermediate layer of a double copper-clad, printed wiring board called Composite CEM-3 similarly to the known glass fiber nonwoven fabric, and in addition, can be used in any position of the printed wiring board in place of the conventional glass cloth. In particular, since the glass fiber content is high and the surface smoothness is excellent, it is preferable to use on the surface of the printed wiring board to which a copper foil is to be laminated (for example, the surfaces of both sides in the double copper-clad, printed wiring board or the surface of each layer in the multilayered printed wiring board).

Moreover, the glass fiber nonwoven fabric of this invention can be used not only in a printed wiring board but also in any other uses and, even when used in, for example, FRP or the like, can be handled without special attention in the same manner as the conventional glass fiber nonwoven fabric or surfacing mat, and there can be obtained a molded article much more improved in surface smoothness.

The glass fiber nonwoven fabric of this invention is one having the above-mentioned construction and has the following characteristics.

Since, as mentioned above, a flat glass fiber has a flatness ratio of at least 2.0, preferably at least 3.1, is used, the flat glass fiber does not stand on the metal wire with the shorter side down in the papermaking and the bulk density becomes high, and since one having a flatness ratio of not more than 10, preferably not more than 8, is used, the drainage time is short and the resin-impregnating property of the product is good.

Incidentally, when a blend of one having a large reduced fiber diameter with one having a small reduced diameter is used, the bulk density can be made much higher by the effect of filling the spaces in the nonwoven fabric composed of the large fibers with the fine fibers, and since the flat glass fibers stand side by side on the surface of the laminate, irregularities are a few and the smoothness is enhanced.

Moreover, since the packing fraction of the flat glass fiber is adjusted to at least 85%, preferably at least 90% and more preferably 93 to 98%, the side face of the glass fiber (the portion corresponding to the longer side of section) has a surface very close to plane and the piled flat glass fibers are in such a state that the said surfaces close to plane are contacted with or approached to one another. Therefore, the adhesion effect in the vicinity of the contact point is greatly enhanced and even when the amount of the binder between fibers is small, the tear strength of the nonwoven fabric is high. Therefore, the amount of the binder which adversely affects heat resistance and water resistance can be made as small as 3 to 8% by weight and there is obtained a laminate having higher performance than a laminate in which a conventional nonwoven fabric is used.

Furthermore, since the glass fibers having a flatness ratio of at least 2.0, preferably at least 3.1, are uniformly dispersed in a random direction, physical properties such as strength, coefficient of thermal expansion and the like have substantially no directional property.

Therefore, in combination with the effect that the bulk density of this nonwoven fabric is high, the warpage and coefficient of thermal expansion of the laminate in which this nonwoven fabric is used become smaller than those of a laminate in which the glass cloth is used. This is a very important element because the fraction defective of a product in which a printed wiring board is used is reduced.

When a hole is bored in the laminate by a laser, the glass fiber melts at a high temperature of the laser right and becomes an amorphous solid called dross to adhere to the surface of the hole. However, since the flat glass fibers constructing the laminate are piled one on another so that the major axis direction thereof becomes parallel to the nonwoven fabric face or since the change of the minor axis of the fiber is small, the melting is uniform, the adhesion state of the dross is uniform and a hole having a clear inner diameter is formed.

The nonwoven fabric has no weave pattern as in the glass cloth. In addition, when a blend of flat glass fibers different in reduced fiber diameter are used, even when thick fibers are used, they are arranged in such a shape that the spaces between the thick fibers are filled with fine fibers, so that the packing density is increased, the surface becomes smoother than that of the nonwoven fabric in which circular cross-section glass fibers are used, and much smoother than the nonwoven fabric in which a conventional flat glass fiber such as an elliptic shape fiber, a cocoon shape fiber or the like is used.

The glass fiber nonwoven fabric of this invention has a high bulk density and flat glass fibers are arranged on the surface thereof to form a very smooth surface as stated above. Therefore, even if in the course of impregnating the same with a resin to prepare a prepreg, the solvent in the resin is removed and the volume of the resin portion is reduced, whereby the so-called sinking phenomenon that the resin moves from the surface to the interior is caused, the sinkage is slight because the amount of the resin is small. In addition, even in the molding step, a volume shrinkage of the resin is caused after the heat-pressing under pressure; however, this volume shrinkage is also very slight. Therefore, there is no case that large cavities are formed on the surface of the laminate, and the surface smoothness is very good. In the result confirmed by the present inventors, as shown in the Examples and Comparative Examples which are described hereinafter, the irregularities on the surface were about a little less than 4 $\mu$m or more, when the conventional glass cloth or glass fiber having an elliptic cross section was used, while the irregularities of the surface could be held to about 2 $\mu$m, when the glass fiber nonwoven fabric of this invention was used. Therefore, when the glass fiber nonwoven fabric of this invention is applied to the surface to which a copper foil is to be laminated in a printed wiring board, the surface becomes very smooth and hence the copper foil surface becomes very smooth, too, whereby the adhesiveness to the copper foil is increased and simultaneously etching can be applied very uniformly to the copper foil. As a result, it is particularly effective for the use of a very thin copper foil of 5 to 10 $\mu$m in thickness and for the enhancement of reliability of the fine line of the laminate.

Moreover, the glass fiber nonwoven fabric of this invention has become higher in bulk density than the nonwoven fabrics used until now, so that the content of glass fiber having a high strength in the molded laminate is increased and the molded article can exert heat resistance and through-hole reliability equivalent to those of a laminate in which a glass cloth is used and a warp-preventing effect equivalent to or higher than a laminate in which a glass cloth is used.

EXAMPLES

In order to cultivate a better understanding of this invention, a specific explanation using Examples is made below. However, this invention is by no way limited these Examples.

Production of Highly Flat Glass Fiber

Example 1

As nozzle chips, there were used those formed by straight boring cylindrical holes in the nozzle portion of each of nozzle chips placed on a nozzle plate and in positions near both ends of the rectangular parallelepiped protruded from the nozzle plate as shown in FIG. 3, said nozzle chips having provided thereon a glass reservoir having the same length as the major axis of the nozzle hole, an area 3.0 times that of the nozzle hole and a depth 2 times the thickness of the nozzle plate; connecting the two bored holes by means of a slit narrower in width than the diameters of the holes to continue the holes into a nozzle hole having a major axis of 4 mm and a major axis/minor axis ratio of 4.1. Moreover, in one of the nozzle hole walls in the major axis direction was provided such a nozzle hole wall notch portion that a width of 60% of the major axis and 30% of the nozzle hole length of 3 mm were cut.

A molten material of the E glass composition was subjected to spinning at a spinning temperature of 1,200° C. at a spinning speed of 2,000 m/min. A glass fiber was able to be stably obtained in which fiber the cross section of the spun filament was such that the major axis was 18.4 μm, the minor axis was 4.5 μm and the reduced fiber diameter was 10 μm, and which fiber had a shape similar to the shape shown in FIG. 1 in which the shorter sides of a rectangle were converted to curved lines.

The flatness ratio was 4.0, the flattening efficiency was 97.5% and the packing fraction of the flat glass fiber was 94.6%.

Example 2

In the same manner as in Example 1, except that the molten glass reservoir of Example 1 was omitted, a flat glass fiber was spun.

A molten material of the E glass composition was subjected to spinning at a spinning temperature of 1,200° C. at a spinning speed of 1,500 m/min. There was stably obtained such a glass fiber that the cross section of the spun filament had a shape of rectangle of 18.5 μm in major axis and 5 μm in minor axis, both ends of the minor axis being curved surfaces.

The fiber obtained had an average value of flatness ratio of 3.7, a flattening efficiency of 90.2% and a packing fraction of flat fiber glass of 94.2%.

Example 3

Production was conducted under the same conditions as in Example 1, except that grooves having the same width as the minor axis of the nozzle chip opening portion and a depth of 0.5 mm were provided at both ends of the major axis on the fore-end surface of the nozzle chip of Example 1. The flatness ratio was 4.0, the flattening efficiency was 98.2% and the packing fraction was 94.6%.

Example 4

Production was conducted under the same conditions as in Example 1, except that a protrusion having the same width as the minor axis of the nozzle hole and a height of 0.5 mm was provided in the positions contacting with both ends of the major axis of the fore-end surface of the notched nozzle chip of Example 1. The flatness ratio was 4.0, the flattening efficiency was 98.6% and the packing fraction was 94.6%.

Comparative Example 1

A flat glass fiber was produced in the same manner as in Example 1, except that the nozzle hole wall notch portion was not provided in the nozzle chip. The amount of the flat glass fiber produced per unit time was 60% of Example 1.

The fiber obtained had an average value of flatness ratio of 1.65, a flattening efficiency of 41.3% and a packing fraction of flat glass fiber of 87.0%.

Example 5

Figure 12:
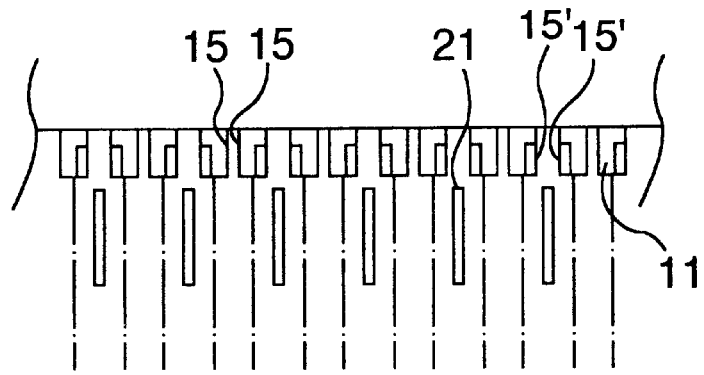
FIG. 12 is a side view showing the relation between the nozzle chips of this invention and cooling fins.

256 pieces of the nozzle chip 11 as shown in FIG. 3 in which the major axis/minor axis ratio of nozzle hole for molten glass was 4.1 were placed so that as in FIG. 9, the longer side of the nozzle chip became rectangular to the longitudinal direction of the nozzle plate 17 and the nozzle hole walls free from the nozzle hole wall notch portion faced one another, and cooling fins 5 were attached between the rows of the nozzle hole wall notch portions facing one another, and spinning was conducted at 1,190° C. at 2,000 m/min (see FIG. 12 and FIG. 15).

Incidentally, the spun flat glass fiber was wound by a winder 25 having a rotation axis parallel to the longitudinal direction of the nozzle plate. The flat glass fiber obtained had a flatness ratio of 4.3 and a flattening efficiency of 104.9, and the variation was a little. In FIG. 15, 22 refers to a water-cooling portion fitted with a cooling fin 21, 23 to a binder applicator and 24 to a gathering shoe. Incidentally, in the present Example, there was used a nozzle chip in which a hot well was provided; however, as far as nozzle chips have the nozzle hole wall notch portion, they can be used without the hot well.

Comparative Example 2

200 pieces of the nozzle chips 11 used in Example 5 were placed so that the longer sides thereof became parallel to the longitudinal direction of the nozzle plate 17 as shown in FIG. 11 and the nozzle hole wall notch portion-free nozzle hole walls 15 were put in the same direction, and cooling fins 21 were attached thereto to cool both end portions of the major axis, and spinning was conducted at 1,190° C. at 2,000 m/min. The mutual positional relation between the nozzle plate and the winder 25 was the same as in Example 5. The flat glass fiber obtained had a flatness ratio of 3.5 and a flattening efficiency of 68.0%; however, the variation was large.

Example 6

180 pieces of the nozzle chip 11 used in Example 5 were placed on a nozzle plate having the same size as the nozzle plate 17 in Example 5 so that the longer sides of the nozzle chips became rectangular to the longitudinal direction of the nozzle plate, cooling fins 5 were attached between the nozzle chips 11 along the width direction, and spinning was conducted at 1,190° C. at 2,000 m/min. The positional relation between the nozzle plate and the winder was the same as in Example 5. The flat glass fiber obtained had a flatness ratio of 4.1 and the variation was a little.

Production of Glass Fiber Nonwoven Fabric

Example 7

(1) Preparation of Nonwoven Fabric

The flat glass fibers produced in Example 1 were cut to a length of 13 mm, the cut fibers were dispersed in water containing 50 ppm of polyethylene oxide as a fiber-dispersing agent so that the concentration became 0.4 g/liter, and the dispersion was subjected to papermaking so that the apparent amount became 20 g/m².

The above wet nonwoven fabric obtained by papermaking was impregnated with a binder solution so that the solid content became 4% by weight, which binder solution had been prepared by blending an epoxy resin emulsion (manufactured by Dainippon Ink & Chemical Inc., EN0270) with an epoxysilane type coupling agent γ-glyoxypropyltrimethoxysilane (manufactured by NIPPON UNICAR Co., Ltd. A-187) as a silane coupling agent, and then dried with hot air at 150° C. to obtain a nonwoven fabric.

(2) Preparation of Laminate

This nonwoven fabric was impregnated with the following resin and dried to prepare a prepreg. The composition of an epoxy resin varnish:

| | |
|---|---|
| Epikote 5046-B-80 (manufactured by Yuka Shell Epoxy Co., Ltd.) | 100 parts by weight |
| Epikote 154 (manufactured by Yuka Shell Epoxy Co., Ltd.) | 20 parts by weight |
| Dicyandiamide | 4 parts by weight |
| Benzyldimethylamine | 0.2 part by weight |
| Dimethylformamide | 30 parts by weight |
| Methyl ethyl ketone | 15 parts by weight |

Ten sheets of this prepreg were laminated and a 18-μm copper foil was laminated to each of both sides thereof, after which they were pressed at a temperature of 170° C. at a pressure of 50 kg/cm² for 60 minutes to obtain a laminate test sample.

(3) Characteristics Measurement

The glass fiber used in the above process, the nonwoven fabric prepared therefrom and the test sample obtained from the nonwoven fabric were subjected to measurement of various physical properties, and hence, the results thereof are shown in Table 1. Here, the measurement methods are as follows. Measurement of fiber diameter and sectional area of glass fiber:

From an electron micrograph of a glass fiber section, the minor axis and major axis of the section, the glass fiber sectional area and the proportion thereof to the area of a circumscribed rectangle were calculated and determined by a computer image processing. Tensile strength of nonwoven fabric: According to JIS R-3420 5.4.

Measurement of Test Sample:

The copper foil was removed by etching from the laminate of test sample and thereafter the laminate was subjected to the following various measurements.

A) Resin content: According to JIS R-3420 5.3.

B) Surface smoothness: According to JIS B-0601 "Method of Measurement of Surface Roughness".

[Six lines were drawn in the form of "⊞" on the sample surface of 100 cm², and in 10 places on each line (60 places in total), the length of one place was made 10 mm, after which the sample was subjected to measurement using a universal shape measuring machine (manufactured by Kosaka Kenkyusho Kabushiki Kaisha, trade name SEF-1A.]

C) Linear expansion coefficient: According to JIS K-7197.

TABLE 1

| | | Example 7 | Example 8 | Example 9 | | Comparative Example 3 | Comparative Example 4 |
|---|---|---|---|---|---|---|---|
| Glass fiber | Flatness ratio | 4 | 4 | 4 | 4 | 4 | 4 |
| | Packing fraction (S/S₀) % | 92 | 92 | 94 | 92 | 75 | 75 |
| | Reduced fiber dia. μm | 10 | 10 | 13 | 8 | 10 | 10 |
| | Fiber length mm | 13 | 13 | 13 | 13 | 13 | 13 |
| | Sectional shape | Highly flat | Highly flat | Highly flat | Highly flat | Approximate to ellipse | Approximate to ellipse |
| | Blending proportion wt. % | 100 | 100 | 60 | 40 | 100 | 100 |
| Nonwoven fabric | Binder amount wt. % | 4 | 6 | 6 | | 6 | 10 |
| | Thickness μm | 57 | 50 | 46 | | 80 | 70 |
| | Apparent amount g/m² | 20 | 20 | 20 | | 20 | 20 |
| | Bulk density g/cm³ | 0.35 | 0.40 | 0.44 | | 0.25 | 0.29 |
| | Tensile strength (longitude) kg/15 mm | 2.8 | 3.9 | 4.2 | | 1.5 | 3.4 |
| | Resin content wt. % | 41 | 41 | 39 | | 52 | 53 |
| Laminate | Surface smoothness μm | 1.8 | 1.9 | 1.6 | | 3.6 | 3.7 |
| | Production workability | Good | Good | Good | | Inappropriate to production | Good |
| | Thermal expansion coefficient ppm/° C. | 14 | 14 | 14 | | | 16 |

Example 8

A nonwoven fabric was prepared under the same conditions as in Example 7, except that in the preparation of the nonwoven fabric, the impregnation with the binder solution was effected so that the solid content became 6% by weight, and also, a test sample was obtained under the same conditions as in Example 7 using the above nonwoven fabric. This result is also shown in Table 1.

Example 9

A nonwoven fabric was prepared under the same conditions as in Example 7, except that as the highly flat glass fiber, there was used a blend of 60% by weight of a glass fiber having a flatness ratio of 4, a packing fraction of 94%, a reduced fiber diameter of 13 μm and a length of 13 mm with 40% by weight of a glass fiber having a flatness ratio of 4, a packing fraction of 94%, a reduced fiber diameter of 8 μm and a length of 13 mm, and the impregnation was effected with an adhesive solution so that the solid content became 6% by weight, and also, a test sample was obtained under the same conditions as in Example 7 using the above nonwoven fabric. This result is also shown in Table 1.

Comparative Example 3

A nonwoven fabric was prepared under the same conditions as in Example 7, except that a glass fiber having a section approximate to ellipse and having a flatness ratio of 4, a packing fraction of 75%, a reduced fiber diameter of 10 μm and a length of 13 mm was used and the impregnation was effected with an adhesive solution so that the solid content became 6% by weight. And it was intended to produce a prepreg using the above nonwoven fabric under the same conditions as in Example 7; however, the strength of the nonwoven fabric was low, so that when it was intended to travel the nonwoven fabric impregnated with the resin, cutting of nonwoven fabric was caused and actual production was decided impossible. Inevitably, in the state that the nonwoven fabric was allowed to stand, the same resin as in Example 7 was applied thereto to prepare a prepreg, and a test sample was obtained using the same under the same conditions as in Example 7. The result thereof is also shown in Table 1.

Comparative Example 4

A nonwoven fabric was prepared under the same conditions as in Example 7, except that in Comparative Example 3, the solid content of the adhesive was changed to 10% by weight, and also, a test sample was obtained using the above nonwoven fabric under the same conditions as in Example 7. This result is also shown in Table 1.

Comparative Examples 5-1 and 5-2

Two kinds of glass cloths shown in Table 2 were prepared and each of them was impregnated with the same resin as in Example 7 and then dried to prepare prepregs.

Each of the prepregs was subjected to lamination and then a 18-μm copper foil was laminated to each side of the laminate, after which the resulting laminate was pressed at a temperature of 170° C. at a pressure of 50 kg/cm² for 60 minutes to obtain laminate test samples. The test samples were subjected to the same measurements as in Example 7. The results thereof are also shown in Table 2.

TABLE 2

|  |  | Comparative Example 5-1 WE18WBZ | Comparative Example 5-2 WEA116E |
|---|---|---|---|
|  | Kind |  |  |
| Glass cloth | Apparent amount | 210 g/m² | 105 g/m² |
|  | Thickness | 200 μm | 100 μm |
|  | Dia. of glass fiber used (circular section) | 9 μm | 7 μm |
| Laminate | Resin content | 39 wt. % | 48 wt. % |
|  | Surface smoothness | 7.9 μm | 3.5 μm |

As is clear from Table 1, when the highly flat cross-section glass fibers of Examples 7 to 9 were used, a nonwoven fabric having the necessary strength for preparing prepreg and a high bulk density was prepared with a binder in a smaller amount than when the glass fibers having a section approximate to ellipse shown in Comparative Examples 3 and 4 were used. Moreover, the laminates prepared in Examples 7 to 9 is smaller in resin content (higher in glass fiber content) than in Comparative Examples 3 and 4 and is very good in surface smoothness. In comparison of Examples 7 to 9, Example 7 in which fibers having different reduced fiber diameters were blended is higher in glass fiber content than and superior in surface smoothness to the other cases, and the laminate of Example 7 has excellent characteristics.

Moreover, as seen from the comparison of Table 1 with Table 2, the laminates prepared in Examples 7 to 9 are superior in surface smoothness to and is by no means inferior in glass fiber content to the laminate in which a glass cloth is used.

Industrial Applicability

As is clear from the above explanation, in the flat glass fiber nonwoven fabric of this invention, there was used such a special highly flat glass fiber that the flatness ratio is 2.0 to 10, preferably 3.1 to 8 and the packing fraction is at least 85%, preferably at least 90% and more preferably 93 to 98%, so that the bulk density of the nonwoven fabric can be increased, the effect of adhesion with a binder can simultaneously be enhanced, the necessary tear strength can be ensured while a concentration as low as about 3 to 8% by weight is adopted as the binder amount, and the thickness of the nonwoven fabric is made small. In addition, the surface smoothness is excellent. Therefore, the flat glass fiber nonwoven fabric of this invention can be suitably used as a reinforcing material for a printed wiring board, can be used in place of a glass cloth in the surface of a printed wiring board in which only the glass cloth has heretofore been able to be used and can, in addition, be used in place of a glass cloth in the surface of a multilayered printed wiring board to which a copper foil is to be laminated.

A printed wiring board prepared using the flat glass fiber nonwoven fabric of this invention can be allowed to have a larger glass fiber content in the board than when the conventionally used glass fiber nonwoven fabric is used, and hence, the heat resistance of the printed wiring board is enhanced, the coefficient of thermal expansion is lowered, and the warpage and twist are diminished, and since the amount of binder used is as small as 3 to 8% by weight, the deterioration of bonding power between the glass fiber surface and the matrix resin due to a surface active agent contained in the binder can be held small, and the hot water resistance and heat resistance are not deteriorated. In addition, since the flat glass fiber nonwoven fabric can be made thin, the printed wiring board can be made thin and can exert the characteristics which are by no means inferior to those in the case where a glass cloth is used. Moreover, the flat glass fiber nonwoven fabric can be produced less expensively than the glass cloth, and hence, the reduction of the cost of the printed wiring board can be intended.

Furthermore, in the printed wiring board in which the flat glass fiber nonwoven fabric of this invention is used in the surface to which a copper foil is to be laminated, the surface smoothness of the surface to which a copper foil is to be laminated is at least equal to that in the case where a glass cloth is used, so that the formation of a circuit by etching can be made with certainty and a printed wiring board having a high reliability can be prepared. In addition, the copper foil to be laminated to the surface can be made thin, and simultaneously the width of a circuit formed by etching a copper foil can be made much smaller, whereby it becomes possible to make the density higher, make the printed wiring board, particularly a multilayered board, much thinner and make the performance of the printed wiring board higher.

Moreover, in the nozzle chip for spinning a glass fiber of this invention, one of the sides in the major axis direction of the nozzle hole provided in the nozzle portion has been notched, so that the molten glass flows by surface tension so that it is pasted to the remaining internal surface of the nozzle chip. And, since one side of the outflow glass contacts with air, the cooling is also accelerated, and the surface viscosity becomes higher than the viscosity of the molten glass flowing out of the conventional nozzle chip and counters the rounding force of the glass, whereby the flattening efficiency is increased. In the case of the conventional nozzle, when the viscosity is increased as mentioned above, it is difficult for the molten glass to flow out of the nozzle hole, and the amount of fiber produced is reduced. However, when the nozzle chip of this invention is used, the low viscosity of the molten glass at the time of flowing out of the nozzle hole remains as it is, and the viscosity is increased while the molten glass flows in the notched nozzle portion which does not have the nozzle hole wall on one side, so that such is not caused and the stability of the sectional shape and the flattening efficiency can be rapidly increased as compared with the conventional case.

Furthermore, by providing a molten glass reservoir on the top of the nozzle portion, the high speed spinning of a flat glass fiber can be further stabilized. Even in a usual nozzle chip, the viscosity of the molten glass in the interior is elevated by cooling effect; however, since the nozzle chip of this invention has provided thereon a molten glass reservoir portion in which the inflow side area of the nozzle hole is at least 1.5 times larger than that of the outflow side area, the flow of the glass in the interior of the nozzle chip is hardly disturbed and the viscosity of the glass rises along the internal surface of the nozzle chip and when the molten glass flows out of the nozzle hole, it becomes a state that the viscosity thereof is high at the external periphery of the section, and becomes quite like a state that glass having a low viscosity is sandwiched in between high viscosity molten glass planes, so that the force to return to the circular section owing to surface tension is weakened, whereby the sectional shape is stabilized. Since this flows out and further flows down in the nozzle portion having the notch portion, the above-mentioned flat glass fiber can be spun at a high speed.

Furthermore, by forming the nozzle hole into a shape similar to a rectangular shape, a dumbbell shape or the like and, if necessary, applying a groove or a convex edge thereto, it becomes possible to produce efficiently a highly flat cross-section glass fiber having a more stable sectional shape and a packing fraction of at least 85%.

In addition, according to this invention, the shapes of nozzle chip, nozzle hole and molten glass reservoir have been simplified, and hence, there are such economical advantages that a general mechanical processing is possible and the cost for producing the nozzle plate is low.

In the nozzle plate of this invention, nozzle chips are placed so that the longitudinal direction of the nozzle plate is rectangular to the major axis direction of the nozzle hole, and cooling fins can be used between the nozzle chip rows, so that the cooling is uniform and the difference in shape of fiber section due to the difference in cooling is small. In addition, when the nozzle plate is placed in such a position that its longitudinal direction becomes parallel to the rotation axis of the binder applicator and/or the rotation axis of the winder, the molten glass spun from the nozzle chips arranged on the nozzle plate is pulled in not the longer side direction but the shorter side direction of the nozzle chip and in the center direction of the nozzle plate because the number of nozzle chips arranged in the longer side direction is small and the nozzle chips at the ends of the longer side of the plate and the point at which the fibers are bundled form a small angle, so that the angle at which the molten glass on the lower surface of the nozzle hole is pulled toward the center portion becomes necessarily small and the sectional shapes of the fibers spun from the nozzle chips near the end portions of the plate longer side are little different from the sectional shape of the fiber spun from the nozzle chip at the center portion. Accordingly, when the nozzle plate of this invention or the process for placing the same of this invention is used, it is possible to stably obtain at a high speed a highly flat glass fiber having a uniform flatness ratio.

Moreover, in the step of spinning the flat glass fiber, when such a construction is taken that the wall surfaces of nozzle chips having the nozzle hole wall notch portion face one another, simultaneously the notch portion-free nozzle hole walls face one another, and cooling fins are placed only between the wall surfaces having the nozzle hole wall notch portion in the nozzle chip, the wall surface having the nozzle hole wall notch portion is strongly cooled and the molten glass flowing through the nozzle hole of the nozzle chip is reduced in surface tension in this notch portion. On the other hand, the notch portion-free nozzle hole wall portion is slightly cooled, so that the temperature of the wall surface is elevated. In addition, between the above surfaces, no cooling fins are placed, and hence, the space can be narrowed by at least the thickness of the cooling fin. As a result, the cooling is further controlled, the temperature of the wall portion is elevated and the production of a glass fiber having a high flatness ratio becomes possible. Moreover, the area in which the nozzle chips are placed is small corresponding to the narrowed space and many holes can be formed in the nozzle plate having the same area.

Further, the nozzle chip for spinning a highly flat glass fiber which comprises a protruded nozzle portion and at least one set of nozzle holes passing through the nozzle portion, wherein in the nozzle hole wall on the nozzle chip wall surface side of the nozzle hole walls in the major axis direction is provided at the section a concave nozzle hole wall notch portion, and each nozzle hole is placed so that the nozzle hole walls in the major axis direction which do not have at the section the concave nozzle hole wall notch portion are mutually continued, has such a structure that the major axis portion and/or minor axis portion of the notch portion-free nozzle hole wall and the corresponding portions of the other nozzle chips are connected without space, so that the above-mentioned effect is exerted much greater.

What is claimed is:

1. A nozzle chip for spinning a flat glass fiber, comprising:

a first pair of nozzle hole walls extending along a major axis, one of said first pair of nozzle hole walls including a notch formed along the major axis;

a second pair of nozzle hole walls extending along a minor axis, the first pair of nozzle hole walls intersecting the second pair of nozzle hole walls so as to define a nozzle hole therebetween; and a nozzle reservoir positioned above said nozzle hole walls and in fluid communication with said nozzle hole.

2. The nozzle chip according to claim 1, wherein a major axis/minor axis ratio of said nozzle hole is 2.0 to 10.

3. The nozzle chip according to claim 1, wherein a notch depth in the one of said first pair of nozzle hole walls is 10% to 100% of a length of said one of said first pair of nozzle hole walls.

4. A nozzle chip for spinning a flat glass fiber, comprising:

a plurality of nozzles, each of said nozzles comprised of:
- a first nozzle hole wall extending along a major axis, said first nozzle hole wall including a notch formed along the major axis;
- a second nozzle hole wall extending along the major axis;
- a third nozzle hole wall extending along a minor axis; and
- a fourth nozzle hole wall extending along the minor axis,
- wherein the first, second, third, and fourth nozzle hole walls intersect so as to define a nozzle hole therebetween; and
- a plurality of nozzle reservoirs, each of said nozzle reservoirs being positioned above a corresponding nozzle of said plurality of nozzles,
- wherein the second nozzle hole wall of each of said plurality of nozzles intersect so as to form a contiguous second nozzle hole wall.

5. The nozzle chip according to claim 4, wherein a major axis/minor axis ratio of said nozzle hole is 2.0 to 10.

6. The nozzle chip according to claim 4, wherein a notch depth in the first nozzle hole wall is 10% to 100% of a length of said first nozzle hole wall.

* * * * *

UNITED STATES PATENT AND TRADEMARK OFFICE
CERTIFICATE OF CORRECTION

PATENT NO. : 6,543,258 B1
DATED : April 8, 2003
INVENTOR(S) : Michio Konno et al.

It is certified that error appears in the above-identified patent and that said Letters Patent is hereby corrected as shown below:

<u>Title page,</u>
Item [22], please correct the following:

Item [22], change the PCT Filed date from "Oct. 1, 1998" to -- Dec. 1, 1998 --

Signed and Sealed this

Thirtieth Day of September, 2003

JAMES E. ROGAN
*Director of the United States Patent and Trademark Office*